(12) United States Patent
Kawasaki et al.

(10) Patent No.: US 7,409,029 B2
(45) Date of Patent: Aug. 5, 2008

(54) TRANSMISSION DEVICE FOR AUTOMATICALLY SET AN OPTIMAL POINT FOR A SIGNAL DECISION MAKING

(75) Inventors: Wataru Kawasaki, Kanagawa (JP); Sunao Ito, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 665 days.

(21) Appl. No.: 09/997,655

(22) Filed: Nov. 29, 2001

(65) Prior Publication Data

US 2003/0007222 A1 Jan. 9, 2003

(30) Foreign Application Priority Data

Jul. 5, 2001 (JP) ............................. 2001-204163

(51) Int. Cl.
*H03D 3/24* (2006.01)
(52) U.S. Cl. ...................... 375/376; 375/371; 375/214; 375/215; 375/362; 375/373; 331/4; 331/12; 331/25; 331/34; 388/911; 455/180.3; 455/260
(58) Field of Classification Search ................ 375/376, 375/354, 362, 371, 373, 215, 214; 331/4, 331/12, 25, 34; 455/180.3, 260
See application file for complete search history.

(56) References Cited

U.S. PATENT DOCUMENTS

| 4,218,771 | A | * | 8/1980 | Hogge, Jr. | 375/376 |
|---|---|---|---|---|---|
| 4,516,083 | A | * | 5/1985 | Turney | 331/1 A |
| 4,625,180 | A | * | 11/1986 | Itaya et al. | 331/2 |
| 5,333,147 | A | * | 7/1994 | Nohara et al. | 375/224 |
| 5,602,879 | A | * | 2/1997 | Wada | 375/355 |
| 5,896,391 | A | * | 4/1999 | Solheim et al. | 714/704 |
| 6,040,738 | A | * | 3/2000 | Uchida | 329/302 |
| 6,115,075 | A | * | 9/2000 | Yoneno | 348/537 |
| 6,154,511 | A | * | 11/2000 | Nakamura et al. | 375/375 |
| 6,188,737 | B1 | * | 2/2001 | Bruce et al. | 375/355 |
| 6,538,786 | B1 | * | 3/2003 | Naito | 398/152 |
| 6,728,526 | B2 | * | 4/2004 | Yamada et al. | 455/260 |
| 6,741,668 | B1 | * | 5/2004 | Nakamura | 375/376 |

FOREIGN PATENT DOCUMENTS

| JP | 02203622 | 8/1990 |
|---|---|---|
| JP | 07066801 | 3/1995 |

* cited by examiner

*Primary Examiner*—Mohammed Ghayour
*Assistant Examiner*—Juan Alberto Torres
(74) *Attorney, Agent, or Firm*—Katten Muchin Rosenman LLP

(57) ABSTRACT

There is provided a flexible transmission device capable of automatically setting an optimal point for a signal decision making with high accuracy, so that highly reliable high-quality signal regeneration control is achieved. A clock timing extraction circuit dynamically sets a frequency-dividing ratio based on the transmission rate of an input signal to perform a phase synchronization control so that there is a fixed phase difference between the input signal and an oscillation output, whereby clock timing based on the transmission rate can be extracted. A regeneration control circuit sequentially sweeps a voltage threshold level and the phase of the extracted cock with respect to the input signal and determines whether the levels of adjacent monitor points match, whereby a decision point within the valid zone of the eye pattern can be automatically measured and used as the optimal point for regeneration control.

14 Claims, 24 Drawing Sheets

IDEAL EYE PATTERN IMAGE
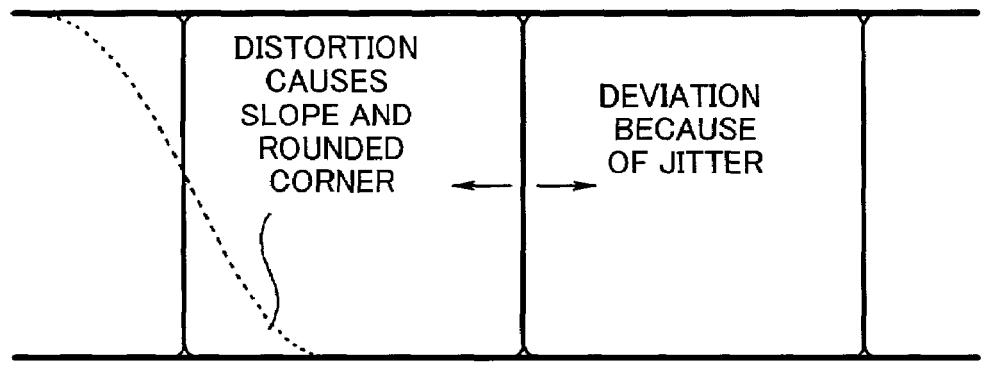
FIG. 7 (A)
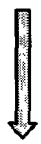
ACTUAL EYE PATTERN IMAGE
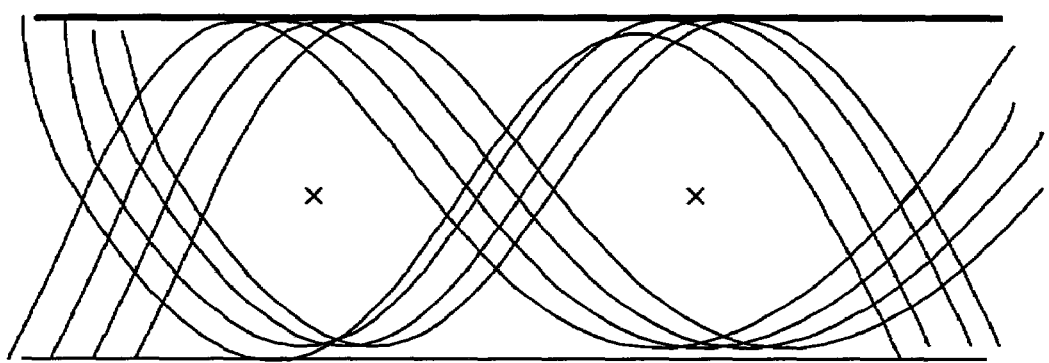
FIG. 7 (B)

|       | D0 | D1 | D2 | D3 | D4 | D5 | D6 | D7 | D8 | D9 |     |
|-------|----|----|----|----|----|----|----|----|----|----|-----|
| Ad00  | ×  | ×  | ×  | ×  | ×  | ×  | ×  | ×  | ×  | ×  | → 0 |
| Ad01  | ×  | ×  | ×  | ×  | ○  | ○  | ○  | ×  | ×  | ×  | → 3 |
| Ad02  | ×  | ×  | ×  | ○  | ○  | ○  | ○  | ○  | ×  | ×  | → 5 |
| Ad03  | ×  | ×  | ○  | ○  | ○  | ○  | ○  | ○  | ○  | ×  | → 7 |
| Ad04  | ×  | ○  | ○  | ○  | ○  | ○  | ○  | ○  | ○  | ×  | → 8 ⇒ (OPTIMAL Vref) |
| Ad05  | ×  | ×  | ○  | ○  | ○  | ○  | ○  | ○  | ○  | ×  | → 7 |
| Ad06  | ×  | ×  | ○  | ○  | ○  | ○  | ○  | ○  | ×  | ×  | → 7 |
| Ad07  | ×  | ×  | ×  | ○  | ○  | ○  | ○  | ×  | ×  | ×  | → 4 |
| Ad08  | ×  | ×  | ×  | ×  | ×  | ○  | ×  | ×  | ×  | ×  | → 1 |
| Ad09  | ×  | ×  | ×  | ×  | ×  | ×  | ×  | ×  | ×  | ×  | → 0 |

|       | D0 | D1 | D2 | D3 | D4 | D5 | D6 | D7 | D8 | D9 |
|-------|----|----|----|----|----|----|----|----|----|----|
| Ad00  | ×  | ×  | ×  | ×  | ×  | ×  | ×  | ×  | ×  | ×  |
| Ad01  | ×  | ×  | ×  | ×  | ○  | ○  | ○  | ×  | ×  | ×  |
| Ad02  | ×  | ×  | ×  | ○  | ○  | ○  | ○  | ○  | ×  | ×  |
| Ad03  | ×  | ×  | ○  | ○  | ○  | ○  | ○  | ○  | ○  | ×  |
| Ad04  | ×  | ○  | ○  | ○  | ○  | ○  | ○  | ○  | ○  | ×  |
| Ad05  | ×  | ×  | ○  | ○  | ○  | ○  | ○  | ○  | ○  | ×  |
| Ad06  | ×  | ×  | ○  | ○  | ○  | ○  | ○  | ○  | ×  | ×  |
| Ad07  | ×  | ×  | ×  | ○  | ○  | ○  | ○  | ×  | ×  | ×  |
| Ad08  | ×  | ×  | ×  | ×  | ×  | ○  | ×  | ×  | ×  | ×  |
| Ad09  | ×  | ×  | ×  | ×  | ×  | ×  | ×  | ×  | ×  | ×  |
|       | ↓  | ↓  | ↓  | ↓  | ↓  | ↓  | ↓  | ↓  | ↓  | ↓  |
|       | 0  | 1  | 4  | 6  | 7  | 8  | 7  | 5  | 3  | 0  |

⇩ (OPTIMAL CLOCK PHASE)

FIG. 21

TRANSMISSION DEVICE FOR AUTOMATICALLY SET AN OPTIMAL POINT FOR A SIGNAL DECISION MAKING

BACKGROUND OF THE INVENTION (1) Field of the Invention

The present invention generally relates to transmission devices, and more particularly, to a transmission device that performs signal regeneration control.

(2) Description of the Related Art

Multimedia times including the Internet have come and the optical communication network technology in a core communication system has been desired to provide much more advancement and broadening of services. And development is progressing quickly towards the information society.

The channel capacity of optical communication is changing from mainstream 2.4 Gb/s to 10 Gb/s. The receiving part in the optical transmission system has been required to have much more advanced receiving functions with increased channel capacity and higher bit rate.

The light receiving part has a fundamental operation such that a received light signal is converted into an electric signal by a photodiode, waveform shaping and noise band restriction being imposed thereon by means of an equalizing filter. Then, a clock timing is extracted by a timing extracting part. A "1"/"0" decision is made by a decision making part in synchronism with the extracted synchronizing clock, so that data can finally be retrieved. In the light receiving part, the above-mentioned regeneration control is performed so that the received light signal that has been attenuated and contained noise is regenerated so as to have an error rate equal to or lower than the target error rate.

The conventional light receiving part widely employs a SAW (Surface Acoustic Wave) filter arranged in the timing extracting part in order to extract the particular clock timing from the input signal. Therefore, there is a disadvantage in that the conventional light receiving parts are capable of handling only single transmission rate and the transmission devices are not flexible.

Regarding optical fiber transmission, different optical fibers have different refractive indexes, and optical transmission paths slightly vary with different wavelengths. This results in differences in the propagation time of light for the same optical fiber. This phenomenon is called waveform dispersion, which is a factor restricting the optical transmission quality.

The conventional light receiving part measures a waveform distortion because of wavelength dispersion, and the optimal point in the decision making part is manually determined for each device. In the setting of the optimal point, it is required to consider difference in the practical devices caused during production, and variations in temperature and/or power supply voltage. Thus, the conventional transmission devices are not efficient, convenient, and reliable.

SUMMARY OF THE INVENTION

Taking the above into consideration, an object of the present invention is to provide a flexible transmission device capable of automatically setting an optimal point for a signal decision making with high accuracy, so that highly reliable high-quality signal regeneration control is achieved.

To accomplish the above object, according to the present invention, there is provided a transmission device performing a signal regeneration control, including: a clock timing extraction circuit dynamically setting a frequency-dividing ratio based on a transmission rate of an input signal to perform a phase synchronization control so that the input signal and an oscillation output have a constant phase difference and extracting a clock timing based on the transmission rate; and a regeneration control circuit sequentially sweeping a voltage threshold level and a phase of an extracted clock with respect to the input signal to determine whether levels of adjacent monitor points match and to automatically measure a decision point within a valid zone of an eye pattern at which there is the least possibility that error occurs and performing the regeneration control by using the decision point as an optimal point.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 7A is a schematic eye pattern diagram of an ideal eye pattern;

FIG. 7B is a schematic eye pattern diagram of an actual eye pattern;

FIG. 21 is a view showing an optimal point setting control;

DESCRIPTION OF THE PREFERRED EMBODIMENTS

Now, embodiments of the present invention will be described with reference to the accompanying drawings. FIG.

1 is a view illustrating the principles of the transmission device of the present invention. A transmission device 1 regenerates a received signal.

A clock timing extraction circuit 10 dynamically sets the frequency-dividing ratio based on the transmission rate of an input signal, and performs a phase synchronization control so that the input signal and an oscillation output have a constant phase difference. In the above manner, the circuit 10 extracts a clock timing that depends on the transmission rate. The above operation is described in more detail by referring to FIGS. 2 through 5.

For the input signal, a regeneration control circuit 20 sequentially sweeps a voltage threshold level and the clock phase of the extracted clock, and determines whether the levels of the adjacent monitor points match each other. In the above manner, the circuit 20 automatically measures the decision point in the valid range of the eye pattern at which there is the least possibility that error may occur. Then, the regeneration control circuit 20 performs regeneration control with the above decision point used as the optimal point, which control will be described later with reference to FIG. 6 and some figures subsequent thereto.

Figure 1:
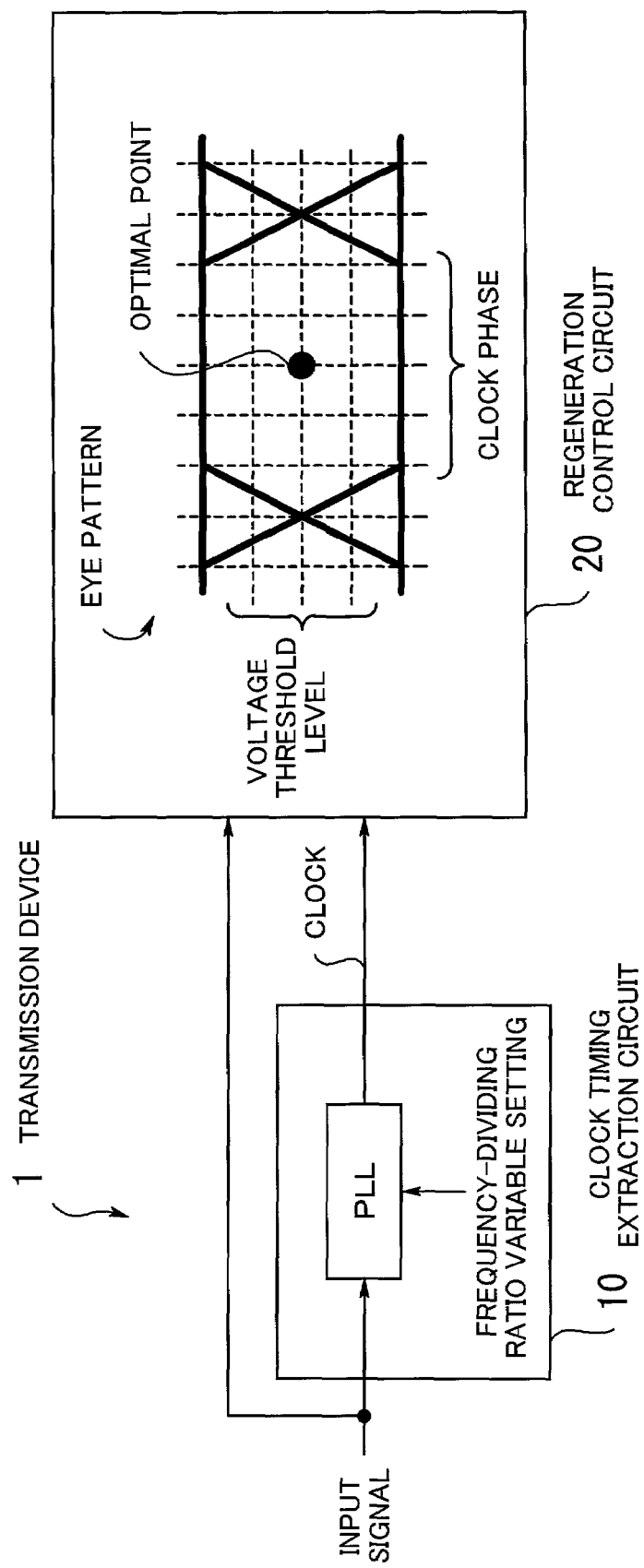
FIG. 1 is a view showing the principles of a transmission device according to the present invention.
Figure 2:
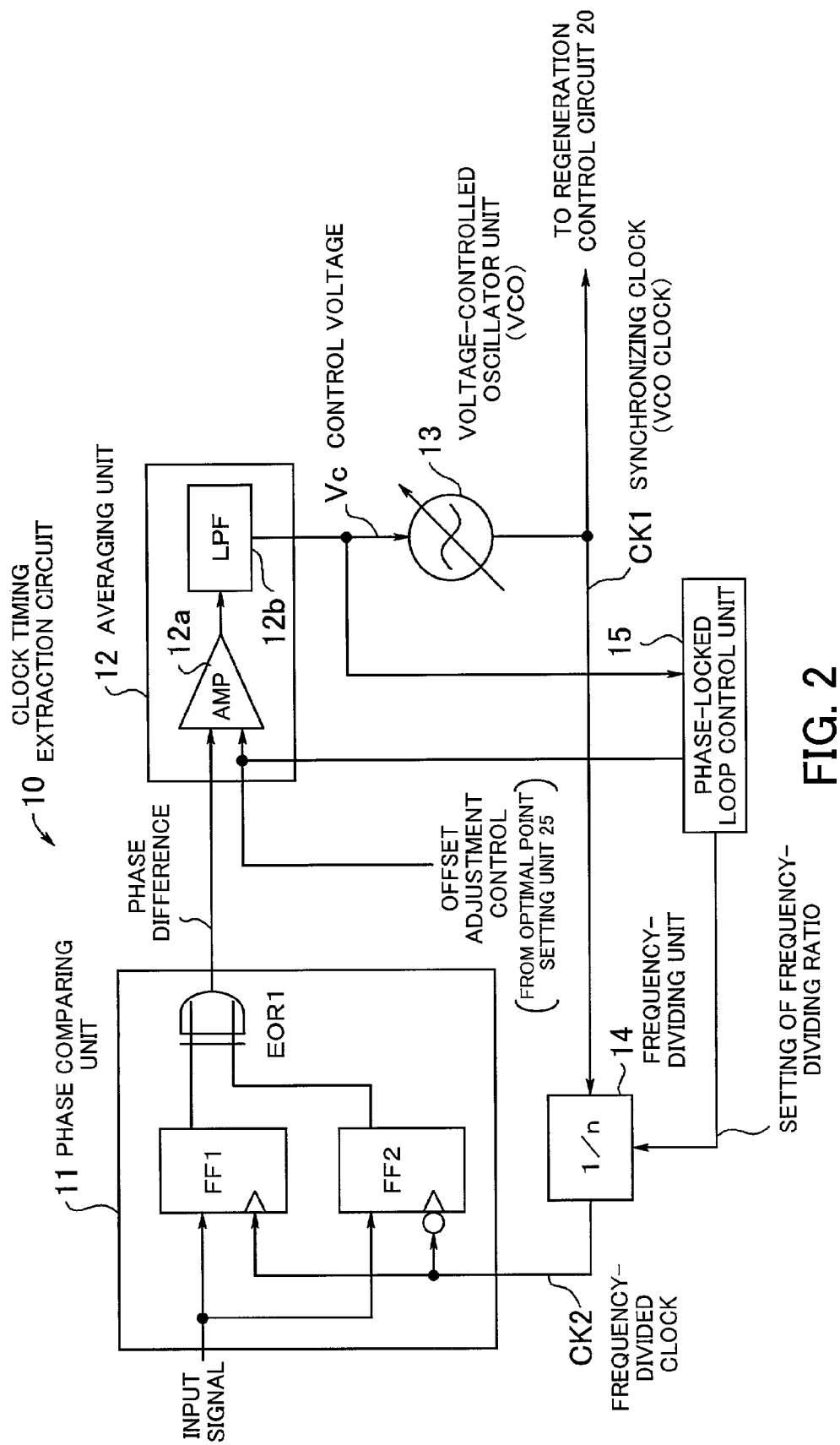
FIG. 2 is a block diagram of a structure of a clock timing extraction circuit.

A detailed description will now be given of the clock timing extraction circuit 10. FIG. 2 is a diagram of the clock timing extraction circuit 10, which is made up of a phase comparing unit 11, an averaging unit 12, a voltage-controlled oscillator unit 13 (hereinafter simply referred to as VCO 13), a frequency-dividing unit 14, and a phase-locked loop (PLL) control unit 15.

The phase comparing unit 11 is made up of two flip-flops (hereinafter referred to as FF1 and FF2), and exclusive-OR element (hereinafter referred to as EOR1). The averaging unit 12 is made up of an amplifier 12a and a low-pass filter 12b (hereinafter referred to as LPF 12b).

The phase comparing unit 11 compares the phase of the received input signal with the phase of a frequency-divided clock CK2, and detects the phase difference as a duty. The averaging unit 12 averages the phase difference that is input via the amplifier 12a, and results in a control voltage Vc. In averaging, high-frequency components are cut off so that the phase difference can be described by DC components. The phase difference is represented by a pulses sequence in which the phase difference is computerized.

The VCO (Voltage Controlled Oscillator) 13 oscillates a synchronizing clock CK1 (hereinafter referred to as VCO clock CK1) on the basis of the control voltage Vc. The VCO 13 can oscillate at up to the maximum frequency of the transmission rate of the input signal. The frequency-dividing unit 14 is formed by counters, and divides the frequency of the VCO clock CK1 so that the frequency-divided clock CK2 can be generated.

The phase-locked loop control unit 15 always monitors the control voltage Vc, and determines whether the control voltage Vc falls within a fixed threshold range, that is defined by a lower threshold value Vc1 and an upper threshold value Vc2.

If the control voltage Vc is within the fixed range (Vc1<Vc<Vc2), the phase-locked loop is recognized to be in a locked state. In contrast, if the control voltage Vc is out of the fixed range, the phase-locked loop is recognized to be in an unlocked state.

If the PLL is in the unlocked state, the current frequency-dividing ratio is changed. The change of the ratio is continuously performed until the PLL is pulled into the clocked state. In the above manner, the clock timing is extracted following the transmission rate of the input signal.

The frequency-dividing ratio is chosen within the variable range of the oscillation frequency of the VCO 13. In determination of the value of "n" of the frequency-dividing unit 14 with a frequency division of 1/n, the number of bits in the built-in counter is selected taking into account the minimal rate of the input signal to be handled by the structure shown in FIG. 2 with respect to the clock rate of the VCO clock CK1.

The phase-locked loop control unit 15 stores the control voltage Vc and the frequency-dividing ratio that has been selected in the above-mentioned manner. At the time of power on, the unit 15 writes the previous-time frequency-dividing ratio obtained at the time of power off in the frequency-dividing unit 14. In this case, unlock information on the PLL is masked until the PLL is stabilized.

If the input signal breaks, the control voltage Vc available prior to breaking is sent to the amplifier 12a, causing the VCO 13 to oscillate at the clock frequency prior to breaking. The breaking of the input signal may be detected by determining whether the control voltage Vc becomes out of the threshold value range or detecting a situation such that no pulse edge of the phase difference is available during a given period of time. The above control enables stabilized clock supply.

In the processing in the regeneration control circuit 20, sweeping of the clock phase is achieved by carrying out a DC-level offset adjustment for the control voltage Vc by applying a voltage to the amplifier 12 so as to change the phase of the VCO clock CK1. The above operation is described by referring to FIGS. 14 through 18.

Figure 3:
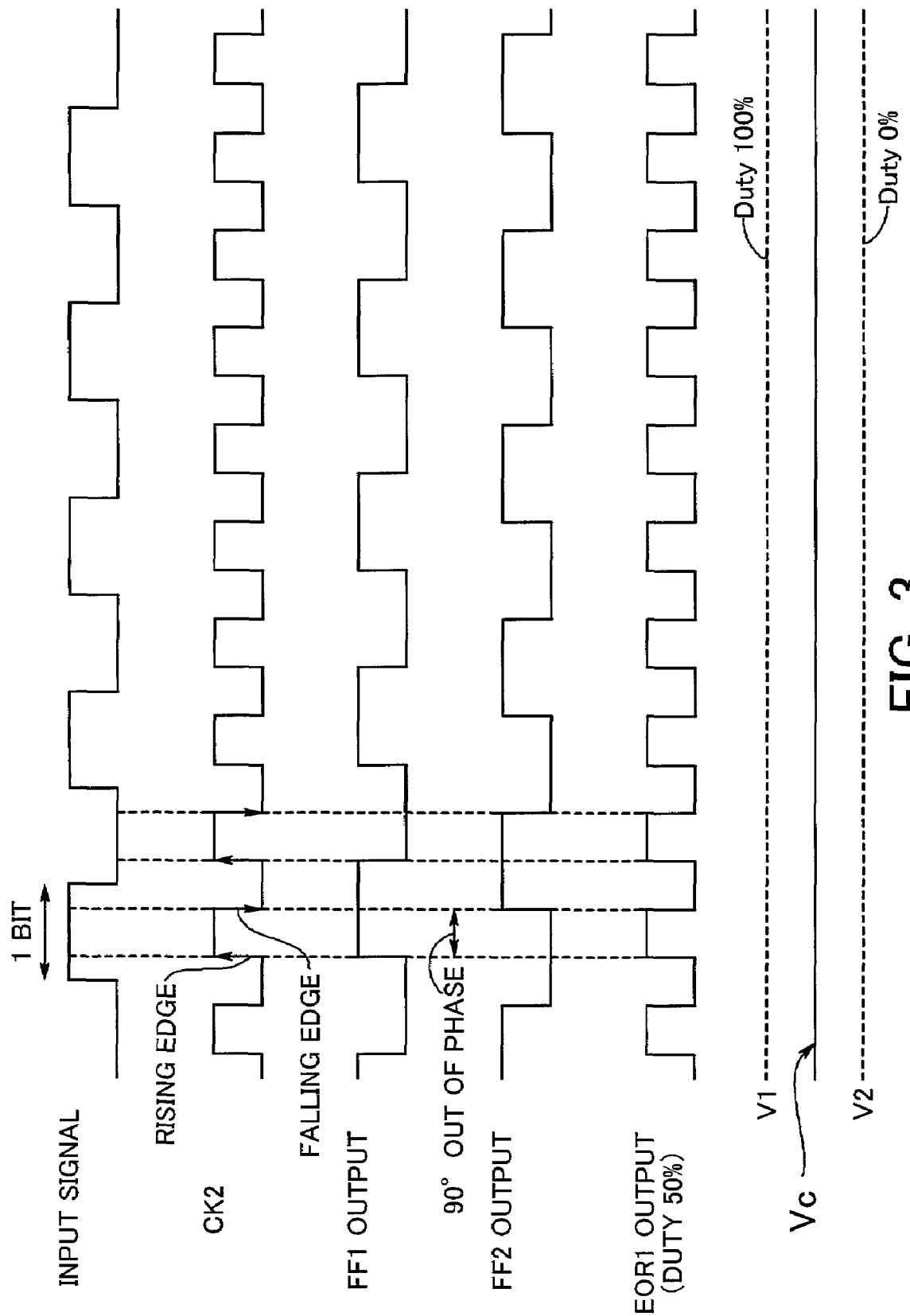
FIG. 3 is a timing chart of an operation of a phase comparing unit.
Figure 4:
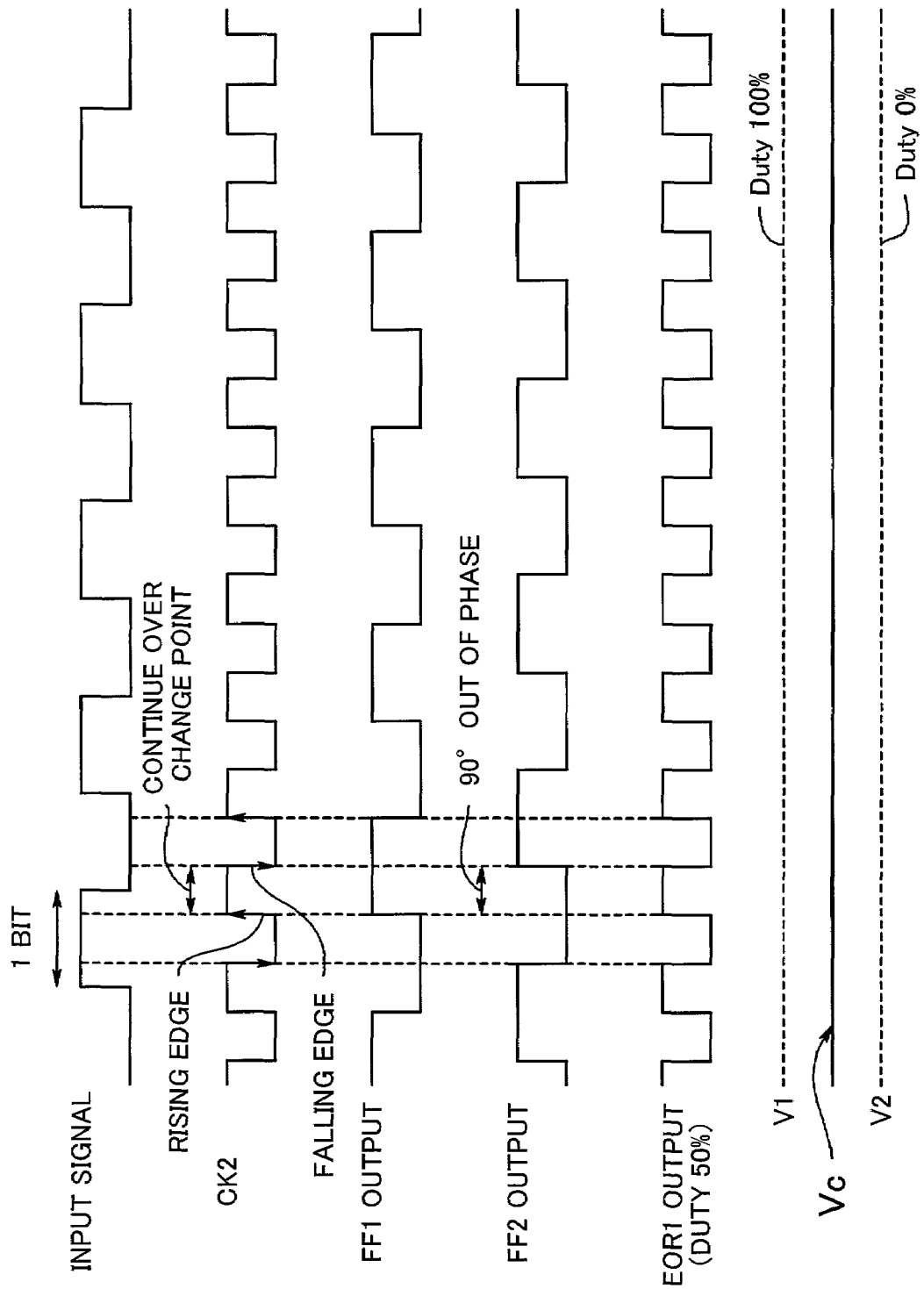
FIG. 4 is a timing chart of another operation of the phase comparing unit.
Figure 5:
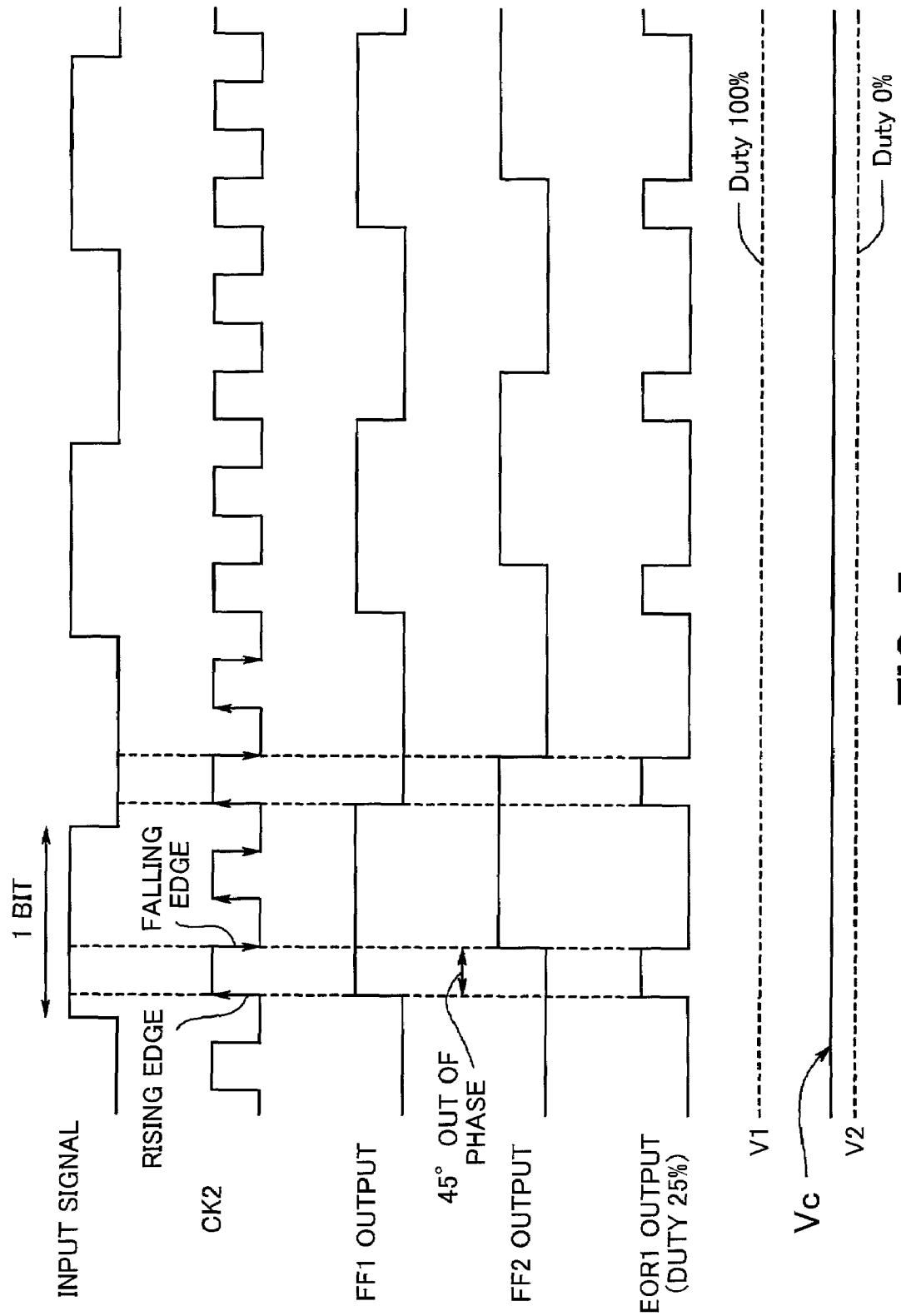
FIG. 5 is a timing chart of a yet another operation of the phase comparing unit.

The phase comparing unit 11 is described. FIGS. 3 through 5 are timing charts of operations of the phase comparing unit 11. FIG. 3 shows a case where the input signal and the frequency-divided clock CK2 have an identical rate in the PLL locked state.

The rising edge of the frequency-divided clock CK2 and the subsequent falling edge thereof are located within one bit of the input signal (here illustrated as a 0/1 alternating clock). The FF1 output synchronized with the rising edge of the frequency-divided clock CK2 and the FF2 output synchronized with the falling edge thereof are 90 degrees out of phase. The FF1 output and the FF2 output are compared by the EOR1, resultant phase-difference data having a duty ratio of 50%.

The control voltage Vc obtained by averaging the phase-difference data by the LPF 12b is located at a medium level between a potential V1 for a duty ratio of 100% and a potential V2 for a duty ratio of 0%. For instance, when the LPF 12b is formed by an ECL (Emitter-Coupled Logic) element, V1 and V2 are approximately equal to −0.8 V and −1.8 V, respectively. Thus, Vc is approximately −1.3 V.

FIG. 4 shows a case where the phase of the input signal changes from the situation shown in FIG. 3. The rising edge of the frequency-divided clock CK2 and the subsequent falling edge thereof are located both sides of an edge of the input signal (not located within one bit). The FF1 output and the FF2 output are 90 degrees out of phase. Thus, the phase-comparison result output by the EOR1 is a duty ratio of 50% as in the case of FIG. 3. Therefore, as long as the transmission rate of the input signal is constant, the situation shown in FIG. 4 does not act as a trigger for change of the frequency-dividing ratio.

FIG. 5 shows a case where the transmission rate of the input signal is changed to ½. Data that is twice the cycle of the frequency-divided clock CK2 is input, and the FF1 output and the FF2 output have doubled cycles. This results in a phase difference of 45 degrees. When the FF1 output and the FF2 output are compared by the EOR1, then phase-difference data with a duty ratio of 25% is available.

The control voltage Vc obtained by averaging the above phase-difference data is located at a level that is ¼ higher than the potential V2 for the potentials V1 and V2 for duty ratios of 100% and 0%. For example, when the LPF 12b is formed by an ECL (Emitter Coupled Logic) element, V1 and V2 are approximately equal to −0.8 V and −1.8 V, respectively. Therefore, Vc is approximately equal to −1.55 V.

As described above, the phase comparing unit 11 carries out the exclusive-OR operation on the level at the rising edge of the frequency-divided clock CK2 and the falling edge thereof, and detects the phase difference as a duty ratio. Then, the averaging unit 12 generates the control voltage Vc that reflects the duty ratio. Finally, the frequency-dividing ratio dependent on the control voltage Vc is determined. It is therefore possible to recognize the transmission rate of the input signal with sufficient accuracy.

As described above, the clock timing extraction circuit 10 according to one aspect of the present invention dynamically determines the frequency-dividing ratio based on the transmission rate of the input signal and performs the PLL control so that the input signal and the oscillation output have the given phase difference. In this manner, the clock timing that depends on the transmission rate can be extracted.

Therefore, there is no need to develop each device exclusively used for the respectively transmission rate. The present invention enables flexible clock timing extraction control.

Figure 6:
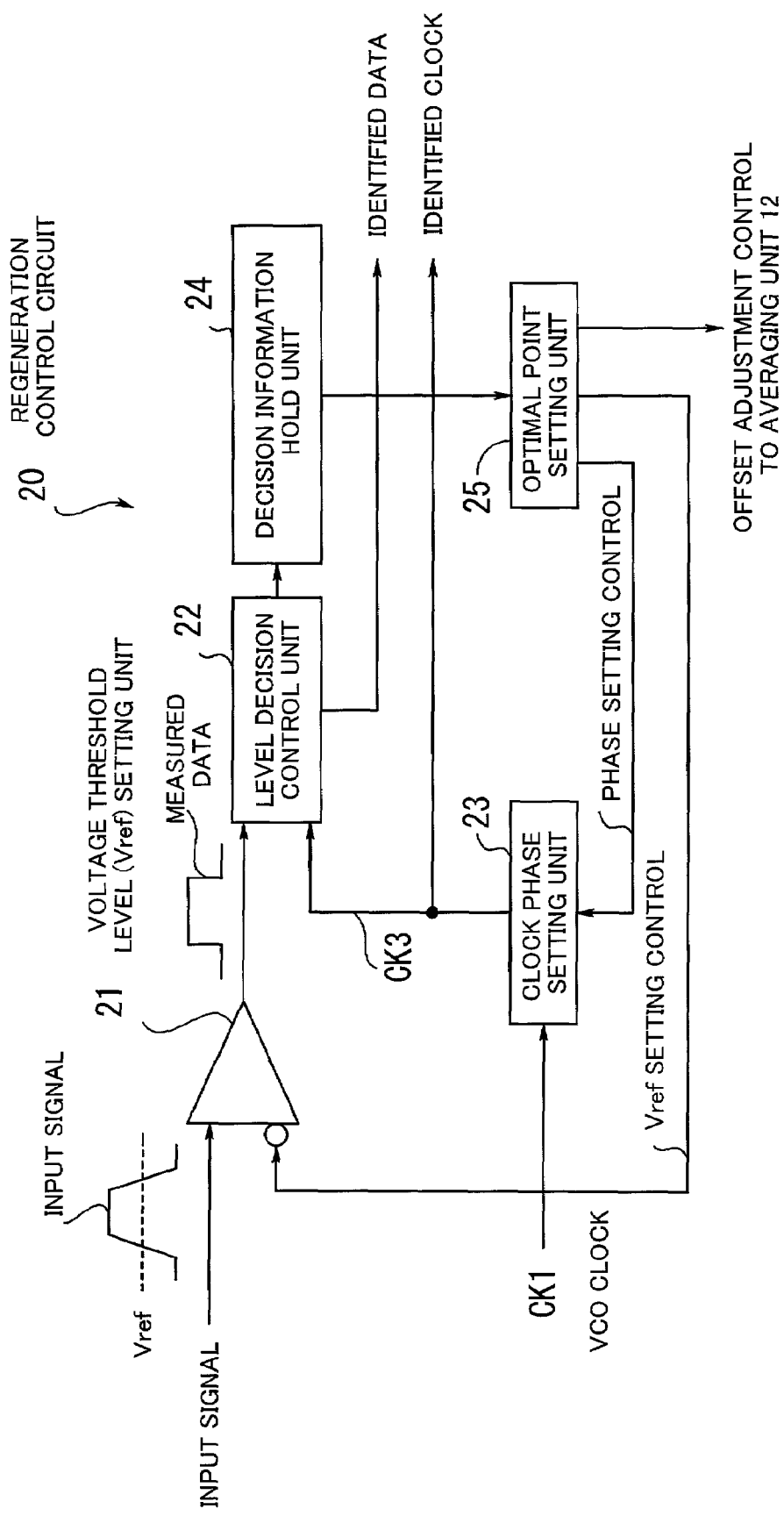
FIG. 6 is a block diagram of a regeneration control circuit.

The regeneration control circuit 20 is now described in detail. FIG. 6 is a diagram of a structure of the regeneration control circuit 20, which is made up of a voltage threshold level (hereinafter Vref) setting unit 21, a level decision control unit 22, a clock phase setting unit 23, a decision information hold unit 24, and an optimal point setting unit 25.

The Vref setting unit 21 makes a signal decision (0/1 logic decision) on the input signal by referring to the threshold voltage Vref set by Vref setting control by the optimal point setting unit 25, and generates resultant measured data. The clock phase setting unit 23 sets the phase of the clock based on the phase setting control by the optimal point setting unit 25 and the VCO clock CK1, and outputs a resultant clock CK3.

The level decision control unit 22 determines whether the levels of the adjacent monitor points match each other in the current clock CK3 and the measured data by a clock delayed by a constant time, and generates resultant decision information. If the levels of the adjacent monitor points match each other, it is recognized that there is an error, and otherwise there is no error. The decision information hold unit 24 holds the decision information obtained at the level decision control unit 22.

The optimal point setting unit 25 has the CPU function and is involved in the Vref setting control of the Vref setting unit 21, the phase setting control of the clock phase setting unit 23, and the offset adjustment control of the averaging unit 12 in order to sequentially sweep the Vref and the clock phase. Then, from the decision information, the point within the valid range of the eye pattern at which there is the least possibility that error may occur. Then, the optimal point setting unit 25 uses the identified decision point as the optimal point for regeneration control.

Next, a detailed description will be given of problems to be solved by the invention. FIGS. 7(A) and 7(B) schematically illustrate eye patterns. More specifically, FIG. 7(A) shows an ideal eye pattern, and FIG. 7(B) shows an actual eye pattern. A waveform distortion occurs during signal transmission. When transmitted signals are synchronized with a clock by a measuring device such as an oscilloscope and are then superimposed, an eye pattern is observed.

If there is no waveform distortion, an ideal waveform as shown in FIG. 7(A) will be obtained. However, waveform distortion during transmission causes slopes and rounded corners of the waveform. Additionally, the signal deviates on the time basis because of jitter. Hence, an actual eye pattern is as shown in FIG. 7(B).

Thus, it can be seen that for signal regeneration, 0/1 decision reference point (optimal point) should be located in the central position (indicated by "x") of each eye pattern. It is to be noted that conventionally, individual devices are manually tested and measured in order to set the decision reference point for signal regeneration.

However, it is practically difficult to achieve quantitative measurement, and the eye aperture ratio is varied due to variation in the signal transmission rate. Thus, the initially set decision reference point may not be constantly the optimal point. This may degrade the transmission quality.

The regeneration control circuit 20 according to one aspect of the present invention automatically recognizes the eye aperture ratio of the eye pattern even when the signal transmission rate varies. In addition, the circuit 20 automatically sets the optimal point for the decision reference point. Thus, highly reliable high quality regeneration control can be achieved.

A description is now given of the sequence up to recognition of the optimal point after the Vref and the clock phase are swept to measure the eye aperture ratio (the eye margin).

Figure 8:
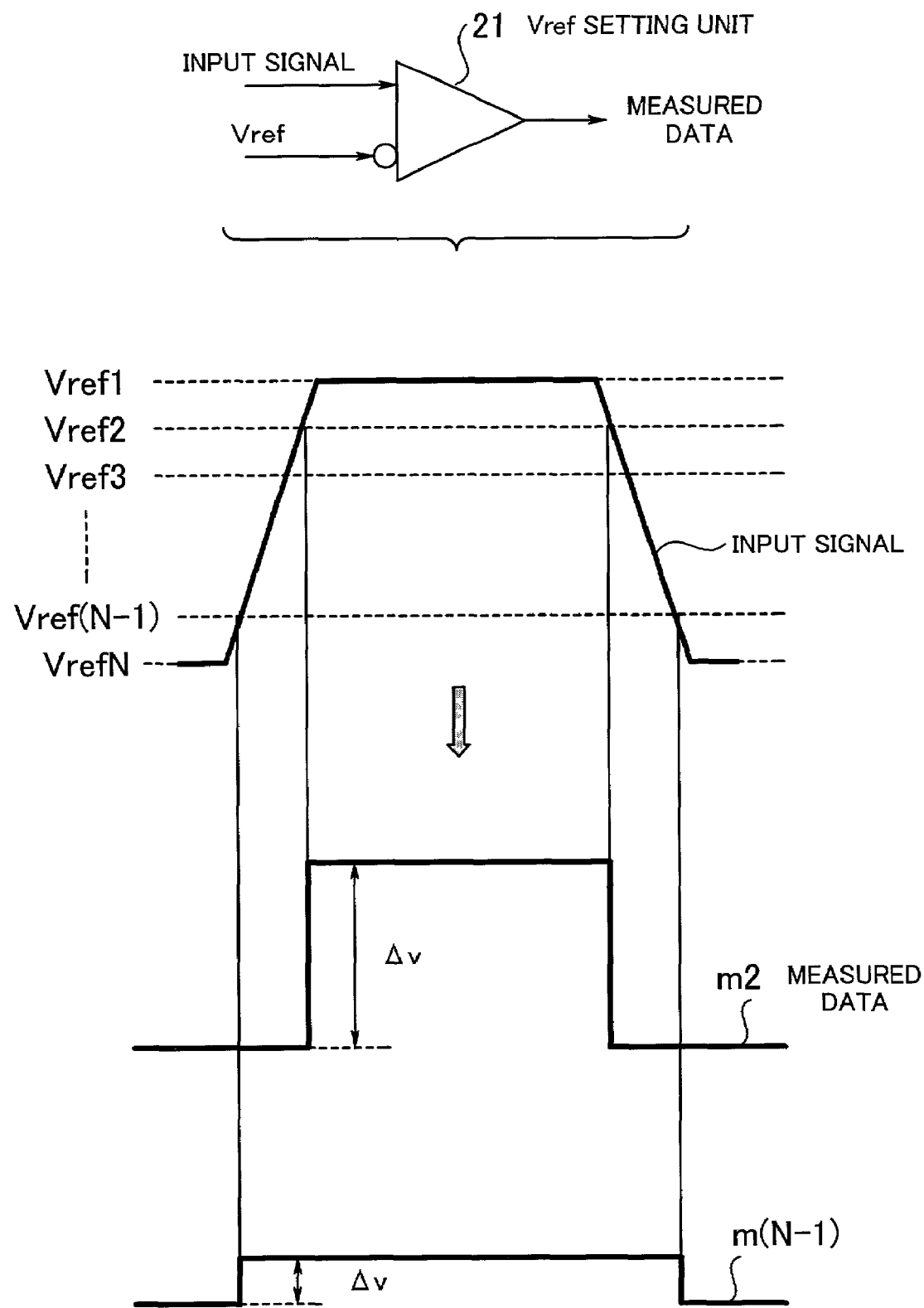
FIG. 8 is a view showing an operation of a Vref setting unit.

FIG. 8 is a view showing an operation of the Vref setting unit 21. The Vref setting unit 21 is formed by a differential input element. In the case shown in FIG. 8, the positive-side input terminal of the differential input element is supplied with the input signal, and the negative-side input terminal thereof is supplied with the voltage Vref serving as the reference voltage. Alternatively, the positive-side and negative-side input terminals are supplied with the Vref and the input signal, respectively.

For the input signal, Vref1 through VrefN are sequentially supplied to the differential input element from the optimal point setting unit 25. Thus, the 1/0 decision on the input signal is made with each of the slice levels defined by Vref-VrefN. The resultant pulse signals serve as measured data.

For instance, when Vref2 is set for the input signal (assumed as a single pulse), measured data m2 is generated. Similarly, when Vref(N−1) is set for the input signal, measured data m(N−1) is generated.

In FIG. 8, the amplitude ΔV of measured data does not depend on the Vref value, but depends on the amplitude characteristic of the Vref setting unit 21.

Figure 9:
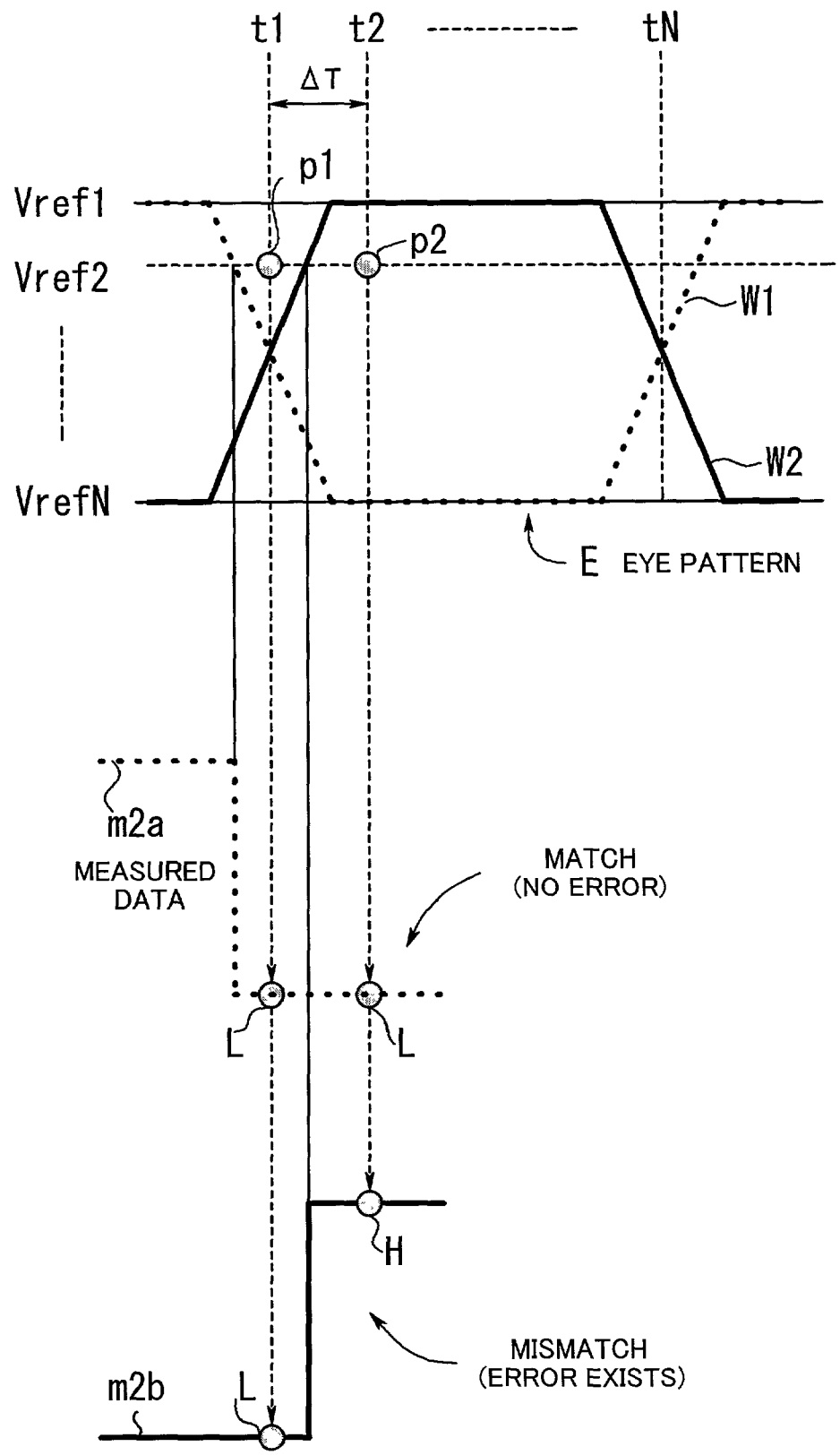
FIG. 9 is a view showing an outline of an eye margin measurement.

FIG. 9 is a view showing an outline of the eye margin measurement. In one aspect of the present invention, the Vref and the clock phase are sequentially swept for the input signal, and it is then determined whether the levels of the adjacent monitor points (lattice points) match each other. In the above manner, the eye margin is measured.

By way of example, a case is considered where an eye pattern E of the input signal, the levels of monitor points p1 and p2 available in phases t1 and t2 (phase difference is ΔT) of the clock CK3 for the level of Vref2.

Measured data m2a is derived from a waveform W1 illustrated with a dotted line by using Vref2. The level of the monitor point p1 at that time is low (L), and that of the monitor point p2 is also L. Thus, it is determined that the levels of the monitor points p1 and p2 match each other and there is no error. The level of the monitor point p1 is acquired by latching the measured data m2a in synchronism with the clock CK3 of the phase t1. Similarly, the level of the monitor point p2 is acquired by latching the measured data m2a in synchronism with the clock CK3 of the phase t2.

Measured data m2b is derived from a waveform W2 illustrated with a thick solid line by using Vref2. The level of the monitor point p1 at that time is low (L), while that of the monitor point p2 is high (H). Thus, it is determined that the levels of the monitor points p1 and p2 do not match each other and there is an error. The level of the monitor point p1 is acquired by latching the measured data m2b in synchronism with the clock CK3 of the phase t1. Similarly, the level of the monitor point p2 is acquired by latching the measured data m2b in synchronism with the clock CK3 of the phase t2.

In other words, with regard to the input signal that is the subject to the eye margin measurement, the levels of the adjacent monitor points among the monitor points obtained by sweeping the phase of the clock CK3 from t1 to tN for the measured data obtained with Vref1 are compared.

Then, Vref2 is enabled, and the levels of the adjacent monitor points among the monitor points obtained by sweeping the phase of the clock CK3 from t1 to tN for the measured data obtained with Vref2 are compared. Then, similarly, each of the remaining Vref up to VrefN is enabled. Finally, the eye aperture ratio (margin) is recognized using the results of the level measurement obtained as described above.

The shifting of monitor point at which the level decision should be made is triggered based on the timing corresponding to the target error rate. This will be described later.

Figure 10:
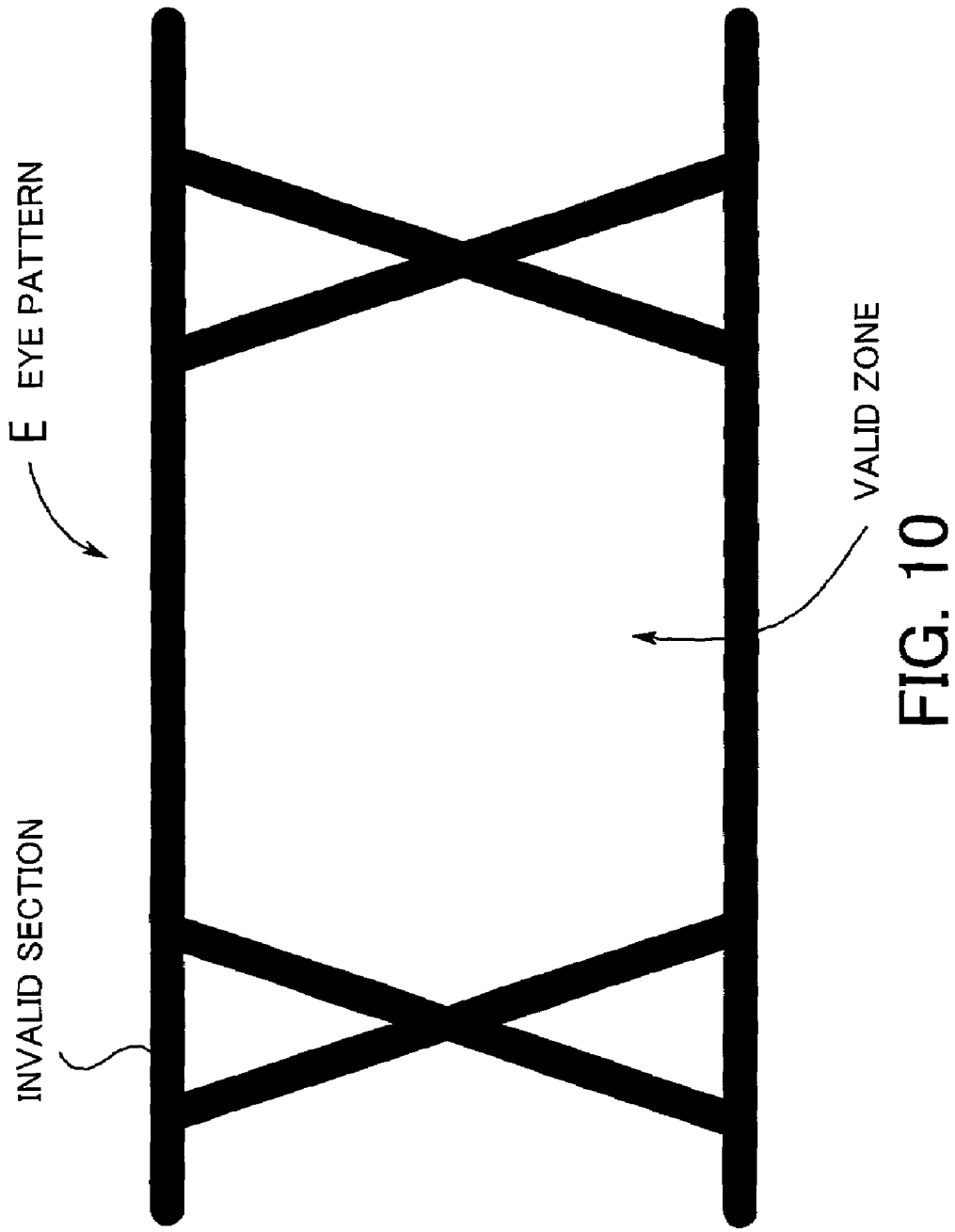
FIG. 10 is a view of an eye pattern.
Figure 11:
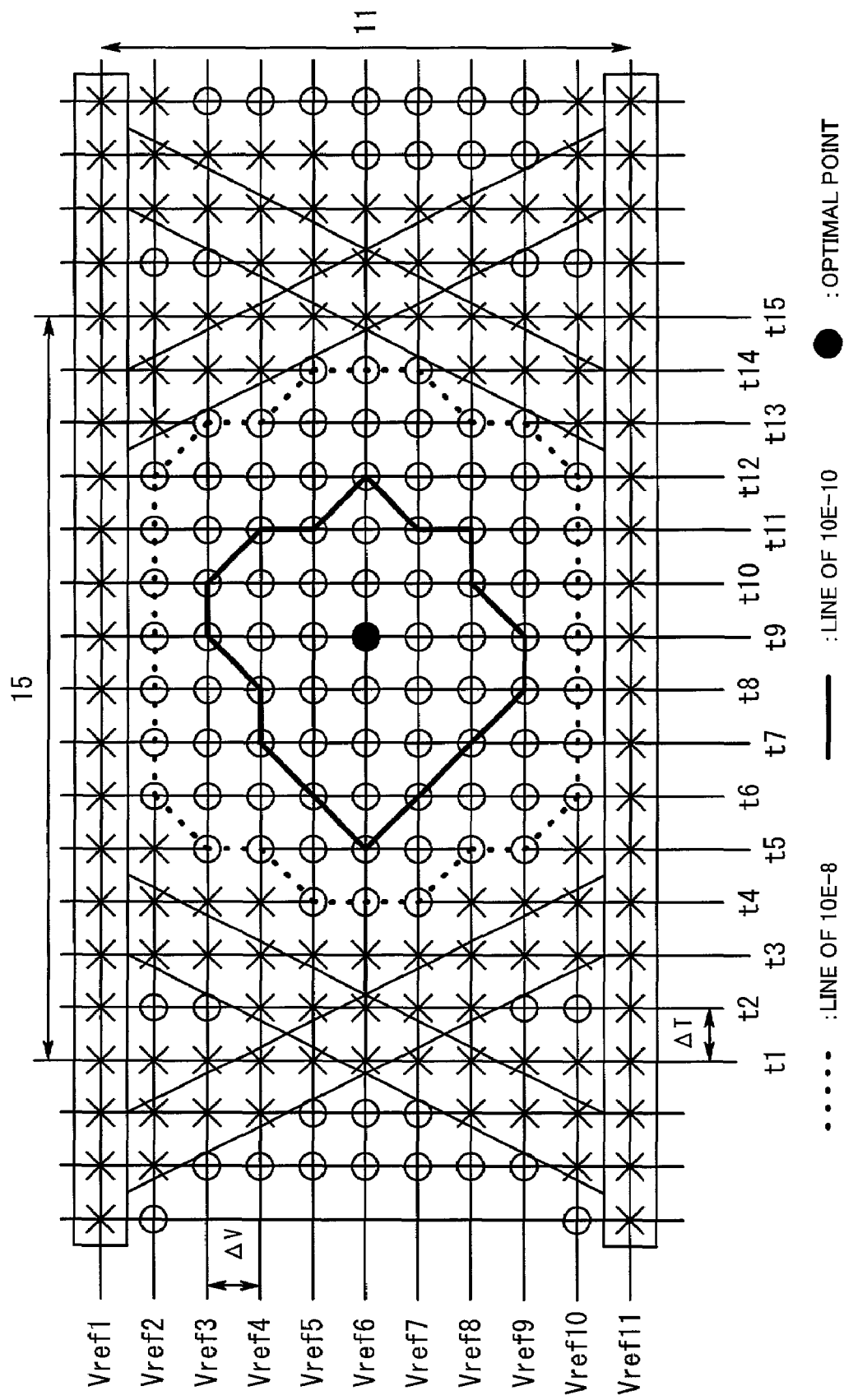
FIG. 11 is a view of an eye pattern with level decision results being added thereon.

FIG. 10 is a view of an eye pattern, and FIG. 11 is an eye pattern with level decision results being illustrated additionally. Referring to FIG. 10, overlapping of waveforms in eye pattern E shown by a thick solid line is called an invalid section, and a blank section corresponding to an eye is called a valid zone.

FIG. 11 shows a way of measuring the eye margin of the eye pattern E of FIG. 10. More specifically, FIG. 11 shows an eye margin measurement with the maximum rate of the input signal equal to the VCO clock CK1.

The section between the high level and the low level is equally divided into ten on the voltage axis so that 11 voltage points Vref1-Vref11 can be set. The difference between the adjacent voltages is equal to $\Delta V$. One cycle of data is equally divided into fourteen so that 15 phase points t1-t15 are set with the difference between the adjacent points equal to $\Delta T$.

Therefore, in the instant example, 165 (=11×15) monitor points exist in one cycle, and all of the adjacent monitor points among them are compared as has been described with reference to FIG. 9, and it is determined whether the levels of these points match each other in order to measure the eye margin and identify the optimal point.

In FIG. 11, a symbol "O" indicates a point at which the level match appears, and a symbol "X" indicates a point at which the level match does not appear. Each point located in the invalid section is assigned "X".

When the phase of the points in the invalid section is denoted as (t−1), each point with phase t on the same voltage Vref is assigned "X" without exception even if each point is located within the valid zone. This is because the level of the previous point to be compared is instable and comparison with instable point is deemed to be level mismatch.

For example, when a decision on the state of phase t5 is made on the Vref2 line, the levels of the phases t4 and t5 are compared, and the comparison result is the state of phase t5. However, phase t4 exists in the invalid section, and the level of phase t5 is deemed to be mismatch. Finally, "X" is assigned to phase t5.

When a decision on the state of phase t6 is made on the Vref2 line, the levels of the phases t5 and t6 are compared, and the comparison result is the state of phase t6. Here, the levels of the phases t5 and 6 match each other, and "O" is assigned to phase t6. Each of the other points is processed similarly to make the level decision. The results thus obtained are stored in a memory (provided in the optimal point setting unit 25) having a capacity of storing the level decision results for the 165 points. This will be described later with reference to FIGS. 20 and 21.

A description will now be given of the cycle of shifting of monitor point. The cycle of shifting to the next phase monitor point on the same Vref line after level decision is based on the target error rate. The cycle of shifting corresponds to the time necessary for measuring the level decision on one monitor point.

Here, assuming that one cycle of the input signal is C second and the target error rate is 10E−n, the cycle of shifting X can be obtained from the following expression:

$$1/10^n = C/X \qquad (1)$$

After the comparing operation on all the monitor points on the same Vref line is completed, the next Vref line is selected for comparison.

For a transmission rate of the input signal of 2.488 Gb/s (one cycle is 400 ps equal to $400 \times 10^{-12}$s) and a target error rate of 10E−8 (=$10^{-8}$) the cycle of shifting X is equal to $400 \times 10^{-12} \times 10^8 = 0.04$ seconds.

Similarly, X is 0.4 seconds when the target error rate is equal to 10E−9 for an input signal of 2.488 Gb/s, and is 4.0 seconds when the target error rate is equal to 10E−10.

That is, when a target error rate of 10E−8 is selected for an input signal of 2.488 Gb/s, the level decision on one monitor point is made for 0.04 seconds. If there is no error, during that time, in other words, if the level mismatch does not occur, this monitor point satisfies 10E−8.

Thus, assuming that the dotted line shown in FIG. 11 is the target error rate of 10E−8 with regard to the eye pattern of the input signal of 2.488 Gb/s, all "O" on the dotted line and all "O" in the frame formed by this dotted-line within the eye pattern valid zone are monitor points that satisfy 10E−8, in which "O" means that no error occurs during the 0.04 seconds.

Assuming that the thick solid line within the eye pattern valid zone denotes the target error rate of 10E−10, all "O" on the thick solid line and all "O" in the frame formed by this solid line are monitor points that satisfy 10E−10, in which "O" means that no error occurs during the 4.0 seconds. If 10E−10 is selected, a small eye aperture ratio will be obtained, as compared to that for 10E−8.

In FIG. 11 the lines of 10E−8 and 10E−10 having the same shape are illustrated for the sake of convenience. However, if the eye pattern shown in FIG. 11 is that for 10E−8, the eye pattern for 10E−10 will have a smaller eye aperture ratio in which the invalid section is thicker and the valid zone is narrower.

The point located in the center of the area surrounded by the line of the target error rate or in the vicinity of the center is set as the optimal point. In FIG. 11, the optimal point for 10E−10 is indicated by "●". The details of setting of the optimal point will be described later.

Figure 12:
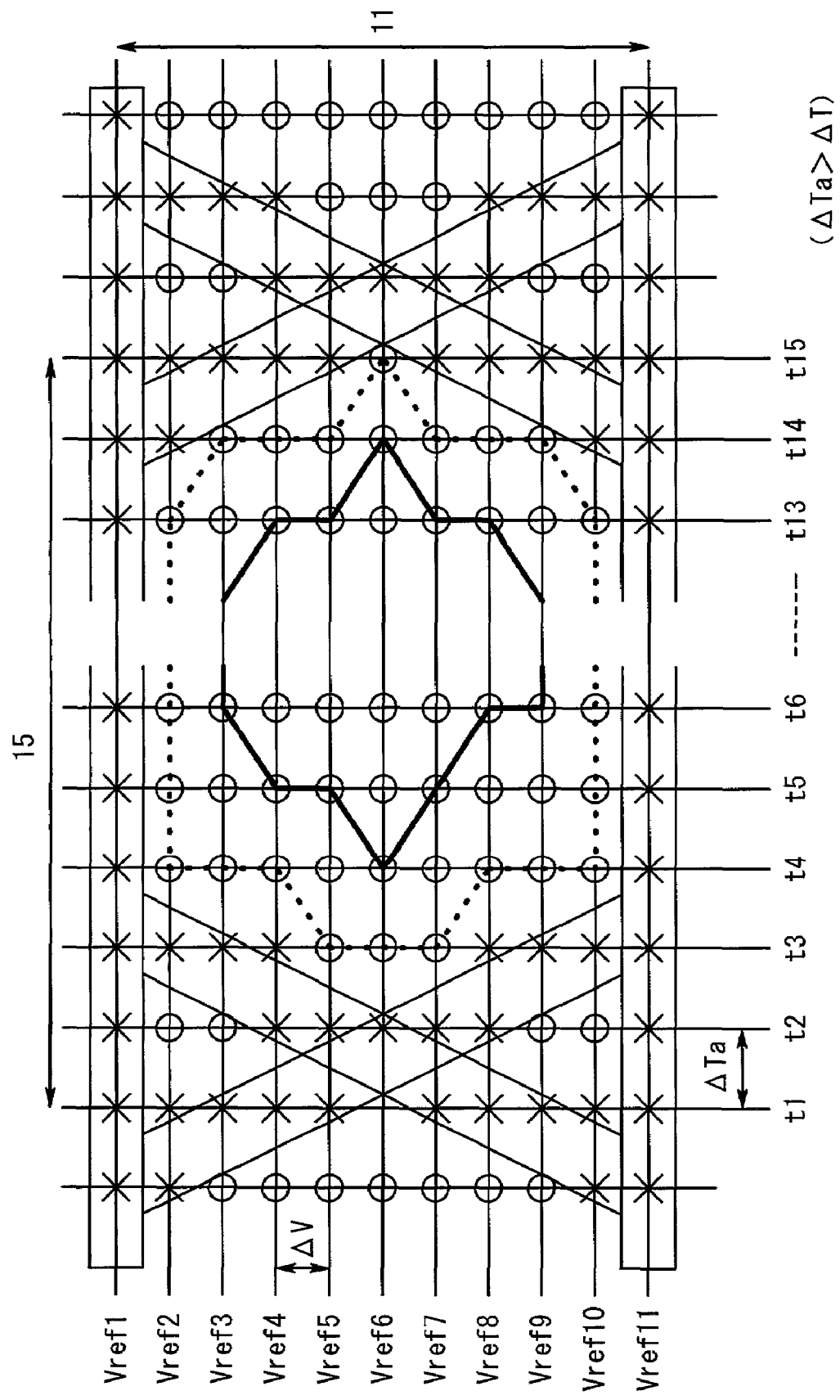
FIG. 12 is a view of an eye margin measurement observed when the input signal is at a relatively low bit rate.

FIG. 12 is a view of an eye margin measurement when the input signal is at a relatively low bit rate. In this case, the Vref step is the same as that shown in FIG. 11, whereas the phase step is different from that in FIG. 11 in that $\Delta Ta$ greater than $\Delta T$ in FIG. 11 is set.

At the low bit rate of the input signal, the eye expands transversely, while the number of monitor points is determined based on the memory capacity. With the above in mind, the phase step width is set greater so as to cause the eye margin measurement to match the transmission rate of the input signal within the fixed memory capacity.

Next, a description will be given of the level decision control unit 22, the clock phase setting unit 23, the decision information hold unit 24, and the optimal point setting unit 25, which units form the regeneration control circuit 20.

Figure 13:
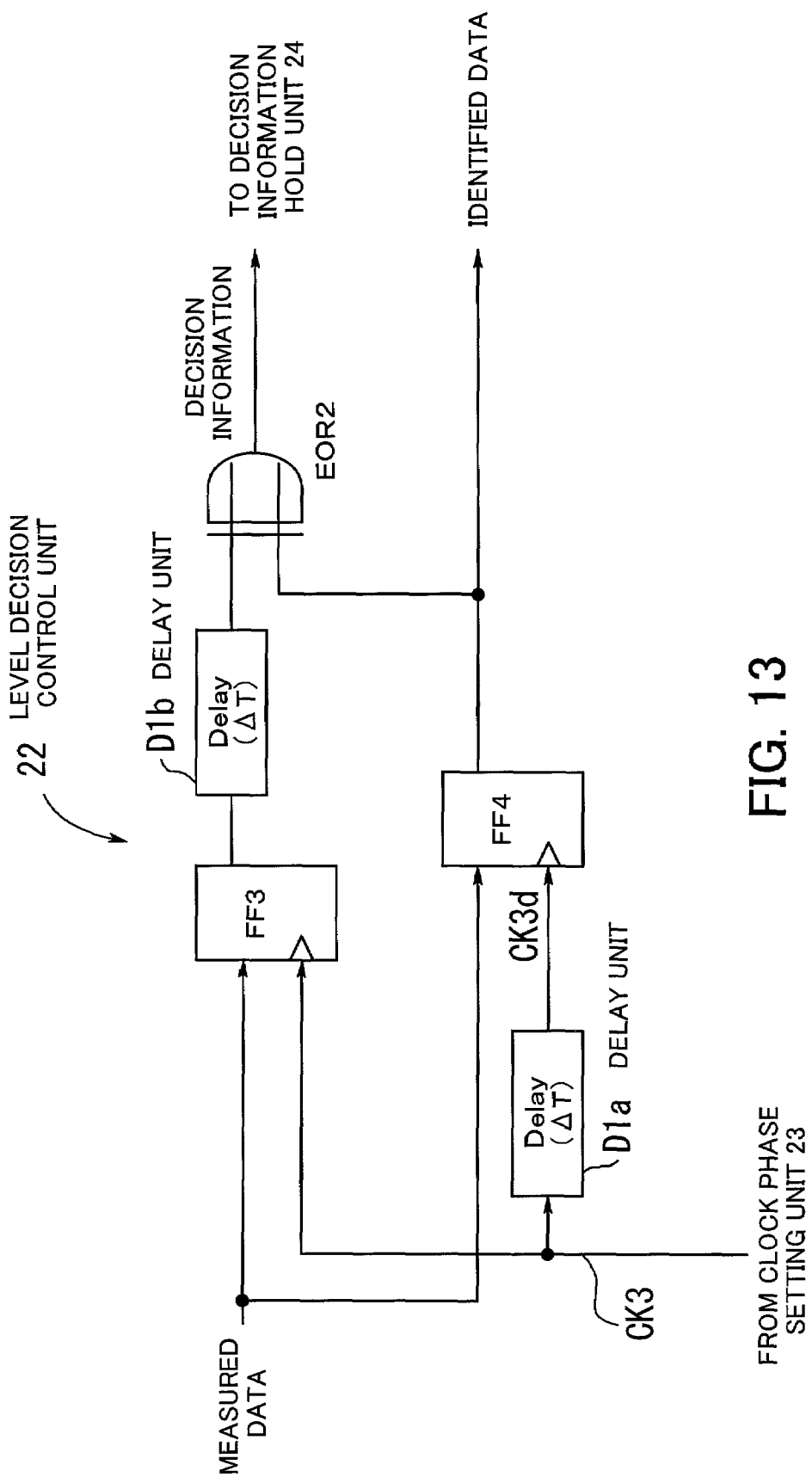
FIG. 13 is a block diagram of a structure of a level decision control unit.

FIG. 13 is a diagram of a structure of the level decision control unit 22, which is made up of two flip-flops (hereinafter referred to as FF3 and FF4), an exclusive-OR element (hereinafter EOR2), and delay units D1a and D1b.

Input data terminals of the FF3 and FF4 are supplied with measured data sent by the Vref setting unit 21. A clock terminal of the FF3 is supplied with the clock CK3 sent by the clock phase setting unit 23. A clock terminal of the FF4 is supplied with a clock CK3d that has been delayed by $\Delta T$ through the delay unit D1a. Thus, when the phase of the clock CK3 is t1, the phase of the clock CK3d is t2 that has been delayed by $\Delta T$.

Further, the output of the FF3 is delayed by the delay unit D1b by $\Delta T$ equal to the delay of the delay unit D1a in order to prevent occurrence of noise and to be in phase with the output of the FF4. The EOR2 makes the exclusive-OR operation on the input signals in order to compare the levels of these signals. If the levels of the input signals do not match, the EOR2 outputs "L" as decision information. If the levels of the input signals match, the EOR2 outputs "H" as decision information.

With the above arrangement, regarding the measured data of each Vref, it is possible to perform the level decision control of the monitor points on the basis of the phase-set clock CK3 from the clock phase setting unit 23. Data identified when the optimal point is set is the output of the FF4.

Figure 14:
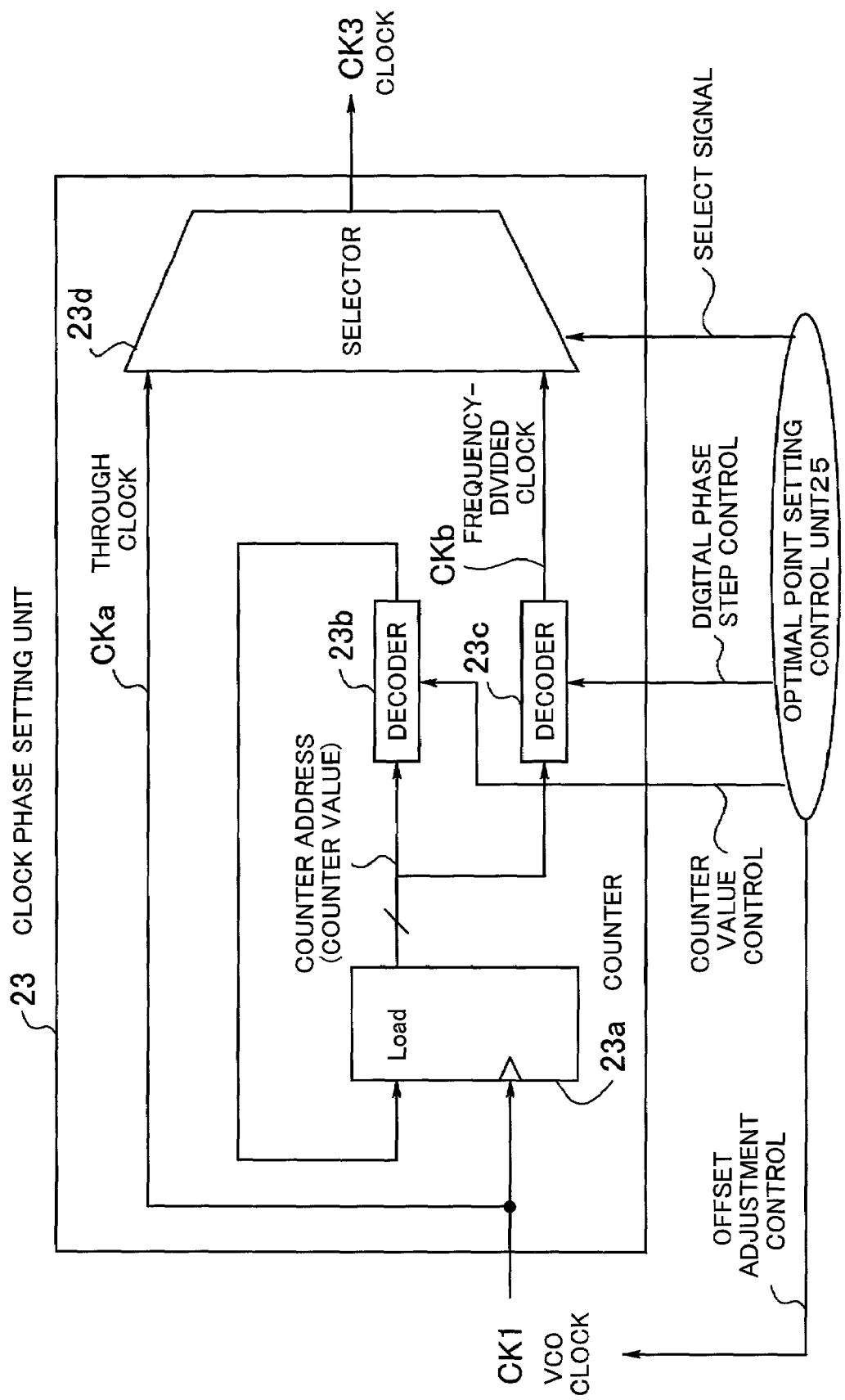
FIG. 14 is a block diagram of a structure of a clock phase setting unit.

The clock phase setting unit 23 is now described with reference to FIG. 14, which illustrates a structure thereof. The clock phase setting unit 23 is made up of an n-bit counter 23a, decoders 23b and 23c, and a selector 23d. A counter value control, a digital phase step control and a select signal, which are all external inputs, are supplied from the optimal point setting unit 25.

The counter 23a is a counter that counts in synchronism with the VCO clock CK1. For instance, when the maximum transmission rate of the input signal is 2.488 Gb/s, the input clock of the counter 23a is the VCO clock CK1 of 2.488 Gb/s.

The number of bits, n, of the counter 23a is determined from the ratio of the input signal rate to the VCO clock rate. Suppose, for example, that the VCO clock CK1 is 2.488 GHz and that the input signal rate can be as slow as 19 Mb/s. The counter 23a is then required to be capable of dividing the 2.488-GHz VCO clock by 128 to produce a 19-MHz signal, and hence n=7.

The decoder 23b generates a decoded value from a counter address on the basis of the counter value control, the decoded value being fed back to a load terminal of the counter 23a, whereby the maximal count value (frequency-dividing ratio) is changed.

The decoder 23c receives and decodes the counter address in which the frequency-dividing rate is set by the decoder 23b, and selects a decoded value based on digital phase step control. The selected decoded value is output as the frequency-divided clock CKb.

The selector 23d selects, in response to the select signal, either a through clock CKa (which is the VCO clock CK1 for the same value as the maximum transmission rate of the input signal) or the frequency-divided clock CKb. The selected clock is sent to the level decision control unit 22 as the clock CK3.

When the VCO clock CK1 is 2.488 Gb/s and the transmission rate of the input signal is also 2.488 Gb/s, that is, when the input signal and the VCO clock CK1 are at the same rate, the through clock CKa is selected. The through clock CKa changes its phase step by step only by the offset adjustment control from the optimal point setting unit 25.

When the transmission rate of the input signal is equal to or lower than 2.488 Gb/s, the frequency-divided clock CKb is selected. The frequency-divided clock CKb changes its phase step by step by the combination of the digital phase step control and the offset adjustment control.

Figure 15:
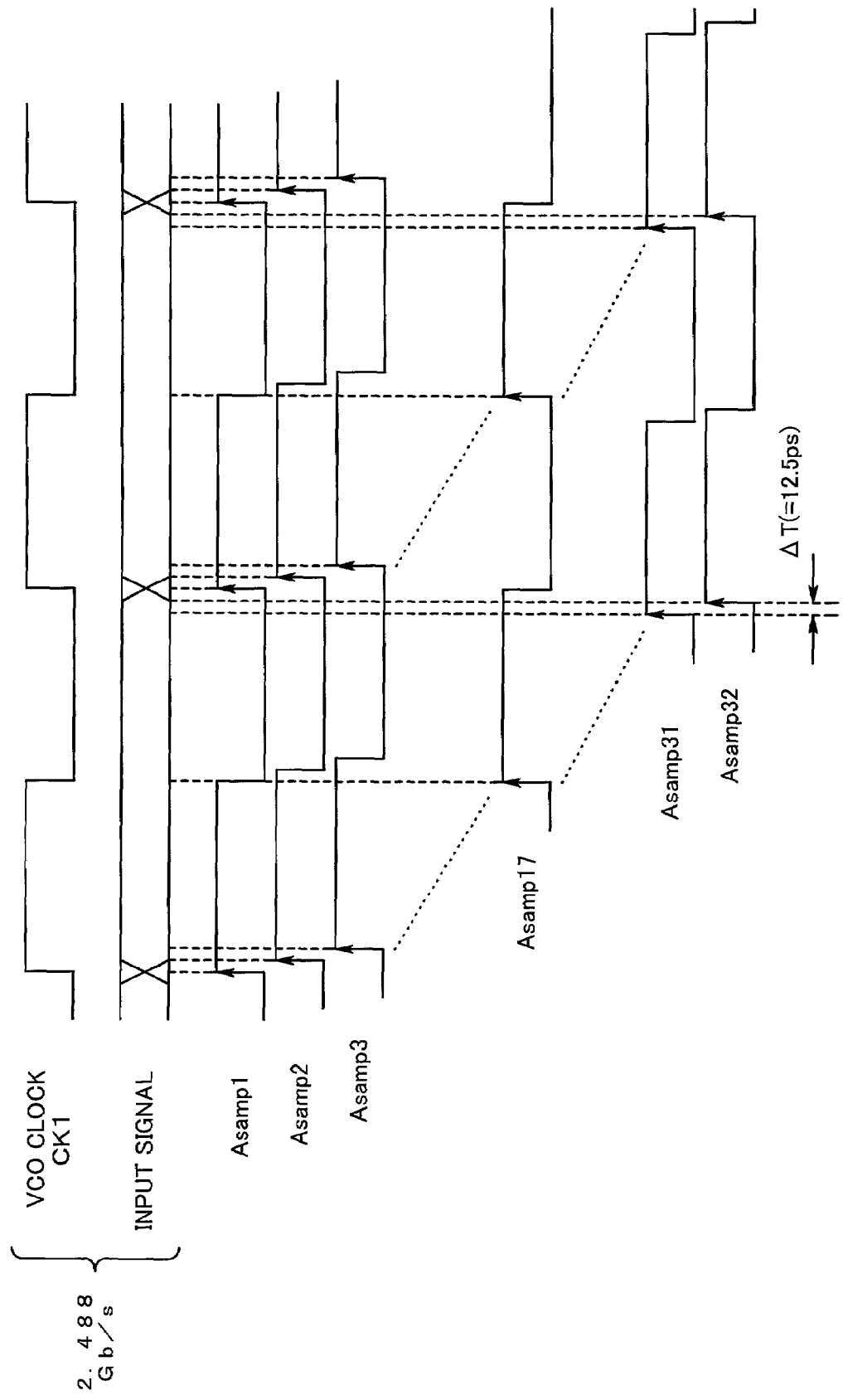
FIG. 15 is a timing chart of clock phase setting.

FIGS. 15 through 18 are timing charts of the clock phase setting. More specifically, FIG. 15 shows a case where the input signal and the VCO clock CK1 are at the same rate of 2.488 Gb/s.

The phase sweep for the same rate is performed so that the optimal point setting unit 25 supplies the clock timing extraction circuit 10 with the offset adjustment control to change the offset of the input voltage to the VCO 13 in stepwise fashion. In FIG. 15, the phase of the frequency-divided clock CKb is changed by 32 steps in one cycle.

Thus, the phase differences ($\Delta T$) between the adjacent phases among the phases Asamp1-Asamp32 is 12.5 ps, which is obtained by dividing one cyle (400 ps) of the input signal into 32. In this case, the monitor points in the transverse direction are t1-t32, that is, there are 32 monitor points.

The optimal point setting unit 25 performs the offset adjustment control for generating a waveform of the phase Asamp2 when recognizing that the level decision at the monitor point in the phase Asamp1 is finished. Then, the clock phase setting unit 23 selects the through clock CKa of the phase Asamp2 thus generated in response to the select signal, and outputs it to the level decision control unit 22. Similarly, the phase sweep of clock is performed for the other monitor points.

Figure 16:
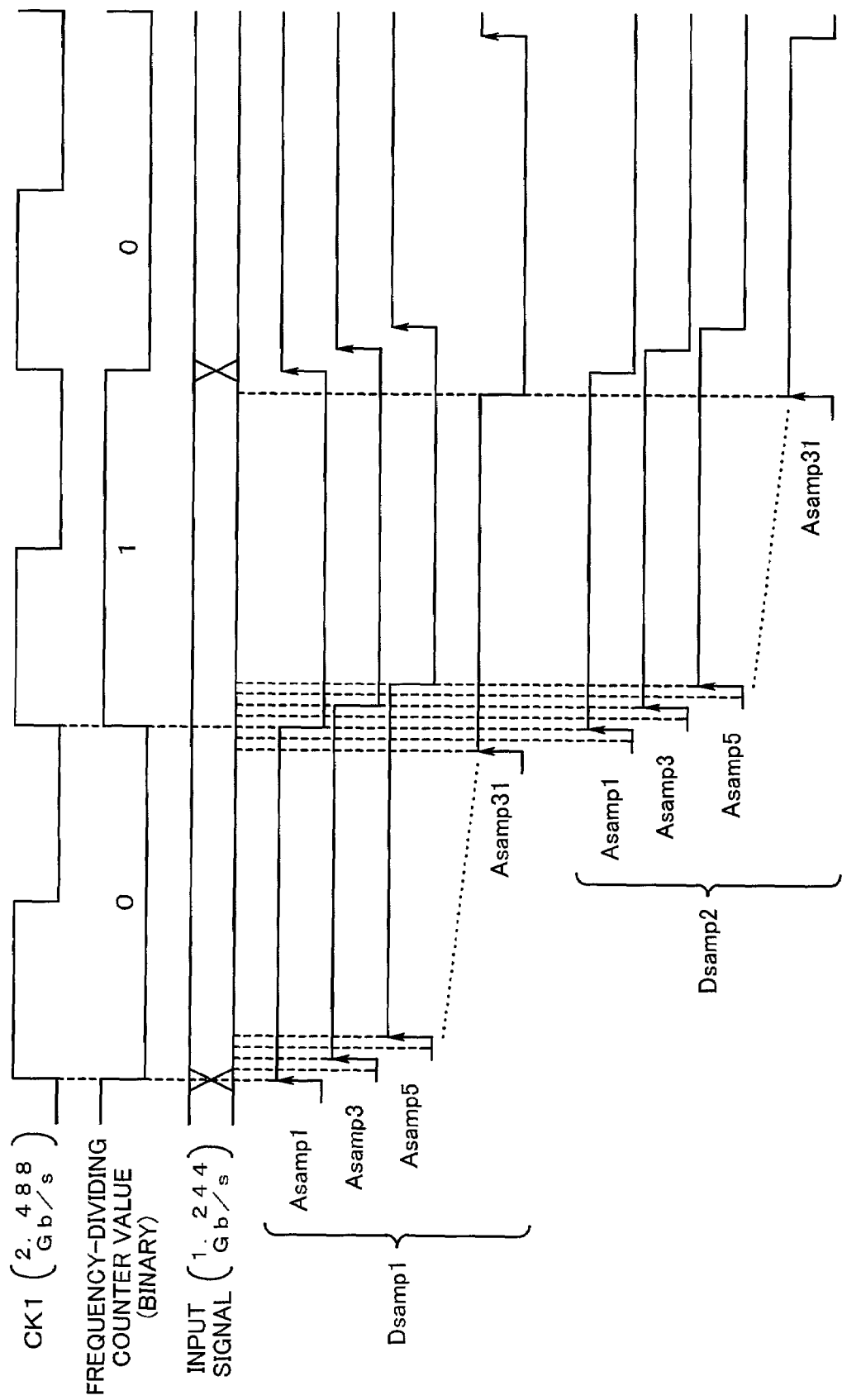
FIG. 16 is another timing chart of clock phase setting.

FIG. 16 shows a case where the VCO clock CK1 is at 2.488 Gb/s and the input signal is at 1.244 Gb/s, that is, the transmission rate of the input signal is half that of the VCO clock CK1.

In this case, the frequency-dividing ratio is ½. Thus, the decoded value of the decoder 23b is controlled by the counter value control, and the counter 23a is set so as to act as a binary counter. The decoder 23c decodes the frequency-divided counter value derived from the ½ frequency division at the counter 23a, so that the frequency-divided clock CKb is generated.

That is, a clock signal with phase Dsamp1 that is the decoded value for counter value "0" and a clock signal with phase Dsamp2 that is the decoded value for counter value "1" are generated. The switching of the decoded value is performed by the digital phase step control.

In FIG. 16, for the first half (phases 1-16) of the data cycle of the phase sweep, the clock signal with phase Dsamp1 obtained by decoding counter value "0" by the decoder 23c is used. Then, the clock signal is processed by the offset adjustment control that has been described with reference to FIG. 15, so that phases of odd-numbered steps among Asamp1-Asamp32 are created. Then, these clock signals are used as frequency-divided clocks CKb, which are selected by the select signal and sent to the level decision control unit 22.

Also, for the second half (phases 1-16) of the data cycle of the phase sweep, the clock signal with phase Dsamp2 obtained by decoding counter value "1" by the decoder 23c is used. Then, the clock signal is processed by the offset adjustment control that has been described with reference to FIG. 15, so that phases of odd-numbered steps among Asamp1-Asamp32 are created. Then, these clock signals are used as frequency-divided clocks CKb, which are selected by the select signal and sent to the level decision control unit 22.

As described above, when the transmission rate of the input signal is lower than that of the VCO clock CK1, the digital phase step control and the offset adjustment control are combined to perform the clock phase sweep control.

Figure 17:
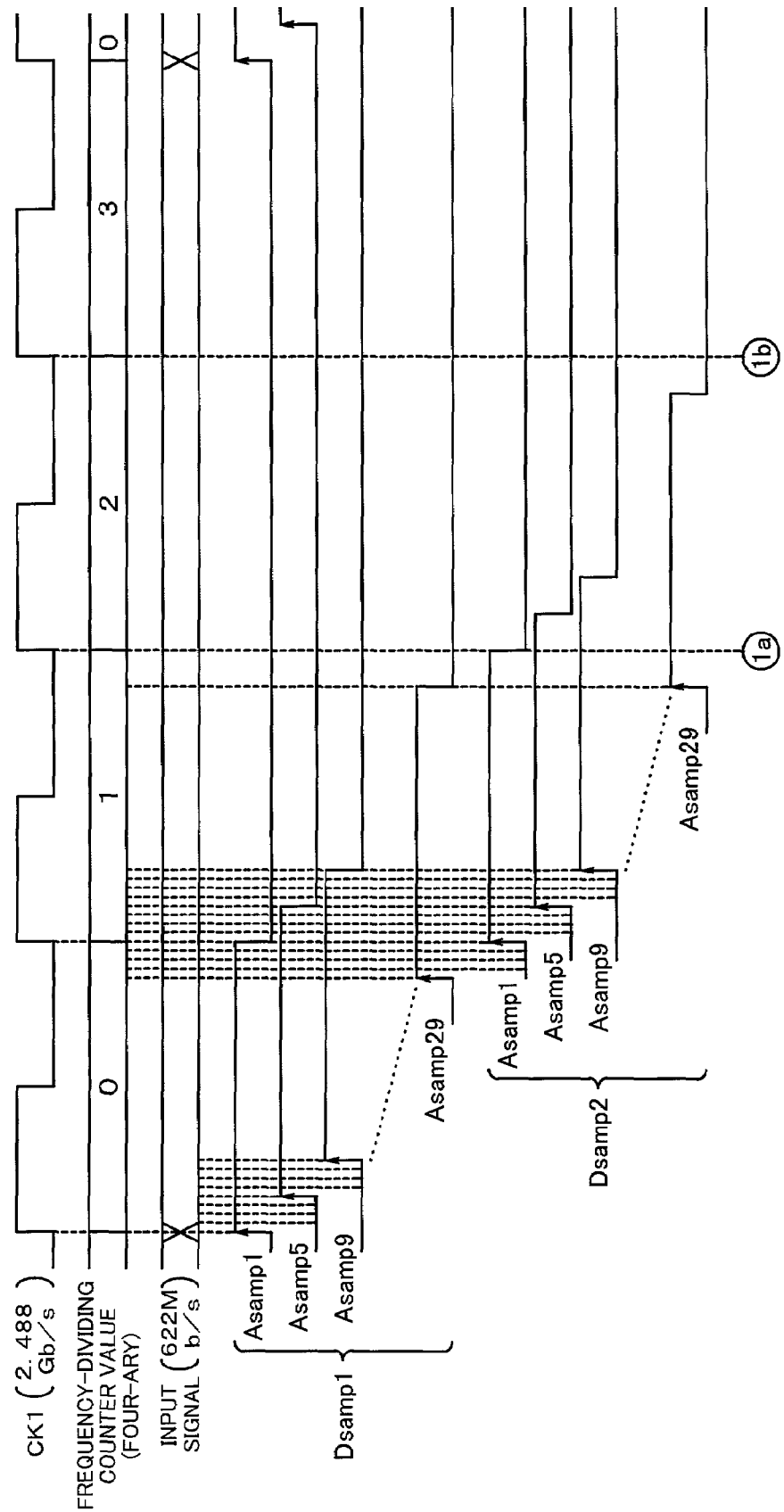
FIG. 17 is yet another timing chart of clock phase setting.
Figure 18:
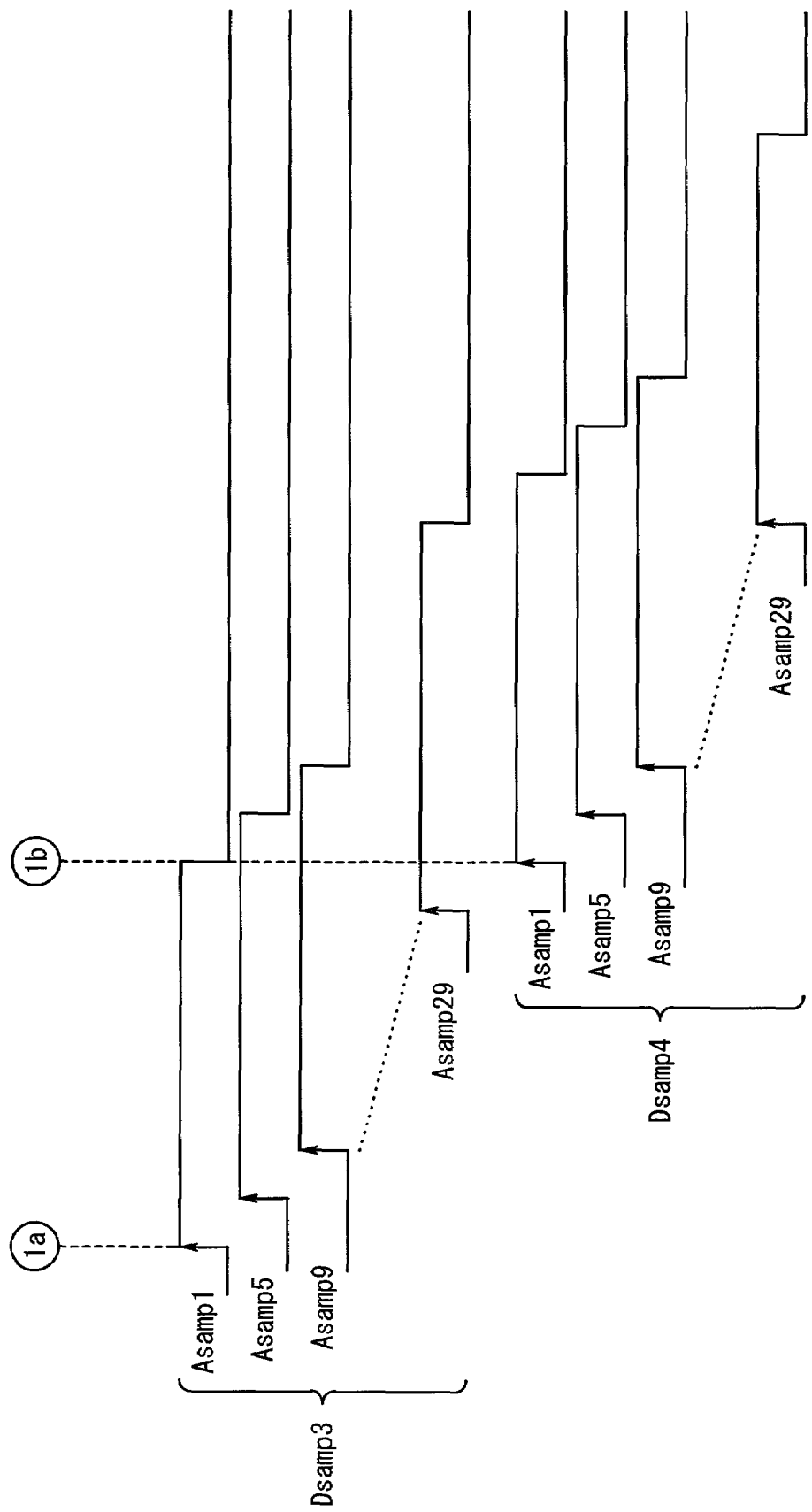
FIG. 18 is a further timing chart of clock phase setting.

FIGS. 17 and 18 show cases where the VCO clock CK1 is at 2.488 Gb/s and the input signal is at 622 Mb/s, that is, the input signal has a transmission rate equal to ¼.

Since the frequency-dividing rate at that time is ¼, the decoded value of the decoder 23b is controlled by the counter value control so that the counter 23a acts as a four-ary counter. Then, the decoder 23c decodes the frequency-divided counter value obtained by the ¼ frequency division by the counter 23a so that the frequency-divided clock CKb is generated.

That is, generated are a clock signal with phase Dsamp1 that is the decoded value for counter value "0", a clock signal with phase Dsamp2 that is the decoded value for counter value "1", a clock signal with phase Dsamp3 that is the decoded value for counter value "2", and a clock signal with phase Dsamp4 that is the decoded value for counter value "3". The switching of the decoded value is performed by the digital phase step control.

In FIGS. 17 and 18, the clock signal with phase Dsamp1 obtained by decoding counter value "0" by the decoder 23c for the first ¼ (phases 1-8) of the data cycle in the phase sweep. The above clock signal is processed by the offset adjustment control that has been described with reference to FIG. 15, so that phases that are spaced apart at an interval of four steps among Asamp1-Asamp32 (Asamp1, 5, 9, 13, ..., 29) are created. These clock signals are used as the frequency-divided clocks CKb, which are selected by the select signal and sent to the level decision control unit 22.

Also, the clock signal with phase Dsamp2 obtained by decoding counter value "1" by the decoder 23c for the second ¼ (phases 1-8) of the data cycle in the phase sweep. The above clock signal is processed by the offset adjustment control that has been described with reference to FIG. 15, so that phases that are spaced apart at an interval of four steps among Asamp1-Asamp32 (Asamp1, 5, 9, 13, ..., 29) are created. These clock signals are used as the frequency-divided clocks CKb, which are selected by the select signal and sent to the level decision control unit 22.

Similarly, for each of the third and fourth remaining ¼ of the data cycle, phase Dsamp3 obtained by decoding counter value "2" and phase Dsamp4 obtained by decoding counter value "3" are processed by the offset adjustment control, so that the frequency-divided clocks CKb are generated.

As described above, when the input signals as shown in FIGS. 16-18 have lower transmission rates than that of the VCO clock CK1, the digital phase step control and the offset adjustment control are combined based on the transmission rates of the input signals so that one cycle is always sampled with phases of 32 steps to accomplish the clock phase sweep control. By the above control, it is possible to fix the memory capacity for storage of level decision information about the monitor points at a constant value. If there is no change of the transmission rate as shown in FIG. 15, the frequency division control flow is omitted for the purpose of time reduction.

Figure 19:
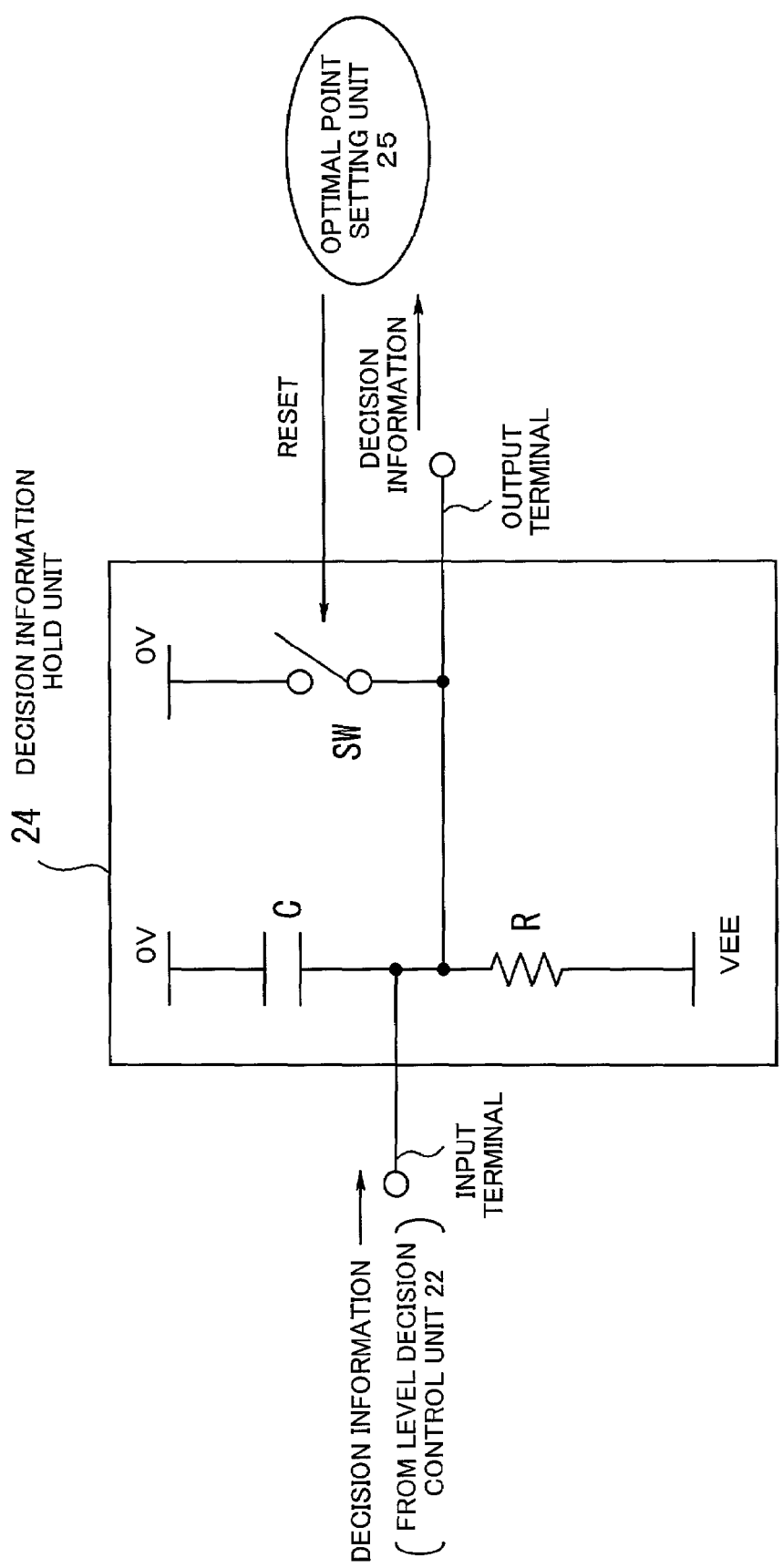
FIG. 19 is a diagram of a structure of a decision information hold unit.

The decision information hold unit 24 is now described below. FIG. 19 is a diagram of a structure of the decision information hold unit 24, which is a peak hold circuit composed of a capacitor C, a resistor R, and a switch SW.

These components are connected as follows. One terminal of the capacitor C is connected to 0 V, and the other is connected to an input terminal via which decision information is input and an output terminal via which decision information is output. Further, the other terminal of the capacitor C is connected one terminal of the resistor R and one terminal of the switch SW. The other terminal of the resistor R is connected to VEE, and the other terminal of the switch SW is connected to 0 V. The ON/OFF control of the switch SW is set by the optimal point setting unit 25.

If the decision information is "L" (error) even only one time, VEE voltage is retained by the capacitor C. The retained decision information is read by the optimal point setting unit 25. The VEE voltage is retained until the capacitor C is reset (discharged) by forcing the optimal point setting unit 25 to turn ON the switch SW (short-circuited to 0 V).

The reset timing is based on the cycle of shifting of monitor point described before. For example, when the input signal is at 2.488 Gb/s and the target error rate is 10E–8, the cycle of the reset timing is 0.04 seconds. For a target error rate of 10E–9, the cycle of the reset timing is 0.4 seconds, and for a target error rate of 10E–10, the cycle of the reset timing is 4.0 seconds.

Now, the cycle of the reset timing of 0.04 seconds (monitor cycle for one monitor point) for a target error rate of 10E–8 will be considered. If an error occurs even only one time in the cycle of the reset timing, the optimal point setting unit 25 immediately reads information indicative of existence of error from the decision information hold unit 24, and writes error-existence information at the memory address related to the involved monitor point. Then, the unit 25 shifts to the next monitor point even before the elapse of 0.04 seconds, and resets the decision information hold unit 24.

If no error occurs during 0.04 seconds, the unit 25 writes no-error information at the corresponding memory address, and shifts to the next monitor point, which is then monitored for 0.04 seconds.

As described above, if an error occurs at a rate higher than the target error rate, the shifting to the next step phase is immediately performed and simultaneously the decision information hold unit 24 is reset. Thus, time reduction in the eye margin measurement is achieved.

Figure 20:
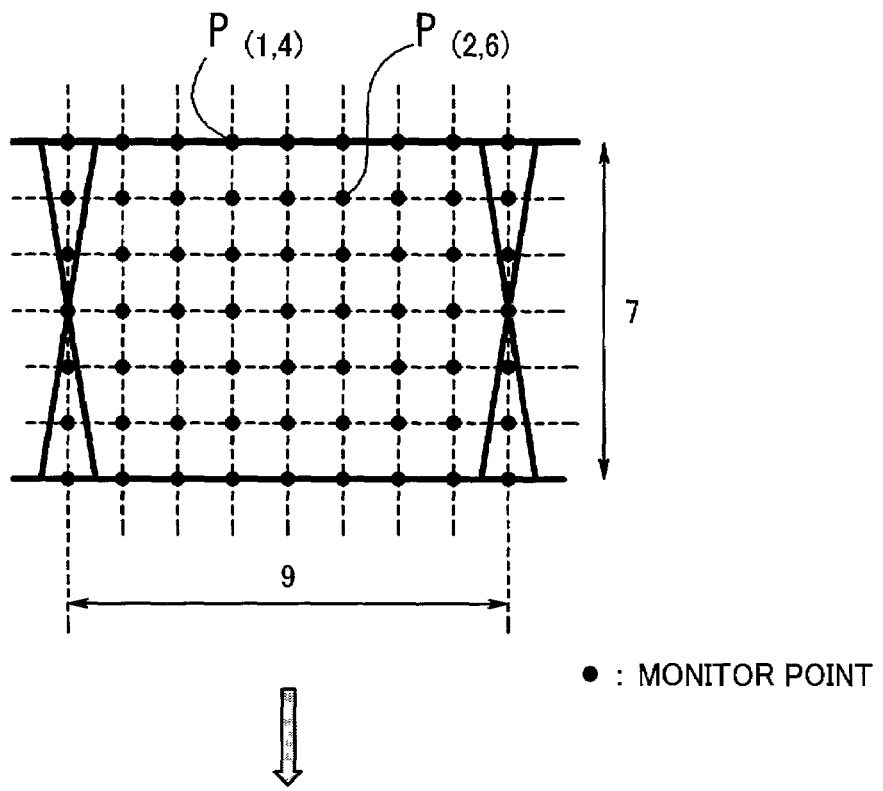
FIG. 20 is a view showing a correspondence relationship between monitor points and a memory.

Next, the optimal point setting control is described. FIG. 20 is a view showing a correspondence relationship between the monitor points and the memory. When there are 63 monitor points within the eye pattern measurement area in which there are seven monitor points (seven Vref values) in the vertical direction and nine monitor points (nine clock phases) in the horizontal direction, the decision information about each monitor point is stored in the memory area in which Vref corresponds to address Ad and the clock phase corresponds to data D.

For instance, the decision information about monitor point $P_{(1,4)}$ is stored in the memory area associated with address Ad00 and data D3. Similarly, the decision information about monitor point $P_{(2,6)}$ is stored in the memory area associated with address Ad01 and data D5.

FIG. 21 is a view showing the optimal point setting control. The optimal point setting unit 25 stores the decision information about each monitor point in the memory as shown in FIG. 20, and detects the optimal point on the basis of the number of items of no-error information about each Vref and the number of items of no-error information about each clock phase.

FIG. 21 shows an example where for a memory capacity of 10×10, decision information is written with the ten Vref steps and ten clock phase steps.

As for the optimal point setting unit 25, the number of "0" assigned to data items D0-D9 is counted for each of the addresses Ad00-Ad09. In the example in FIG. 21, there are eight symbols of "O" at address Ad04, which is judged as the optimal Vref.

Next, the number of "O" assigned to addresses Ad00-Ad09 is counted for each of the data items D0-D9. In the example, there are eight symbols of "O" at data D5, which is judged as the optimal clock phase. Consequently, the optimal point indicated by the black square frame is determined to be optimal.

Thus, the result of the eye margin measurement shows that the voltage Vref at the time of address Ad04 is the optimal threshold voltage and the clock phase at the time of data D5 is the optimal clock phase. Then, the threshold voltage Vref thus identified is set in the Vref setting unit 21, and the clock phase thus identified is set in the clock phase setting unit 23, so that the optimal regeneration control of the input signal is achieved.

Also, the optimal point setting unit 25 memorizes the threshold voltage Vref and clock phase at the monitor point judged to be optimal, and performs the regeneration control with the memorized Vref and clock phase at the time of restarting.

Figure 22:
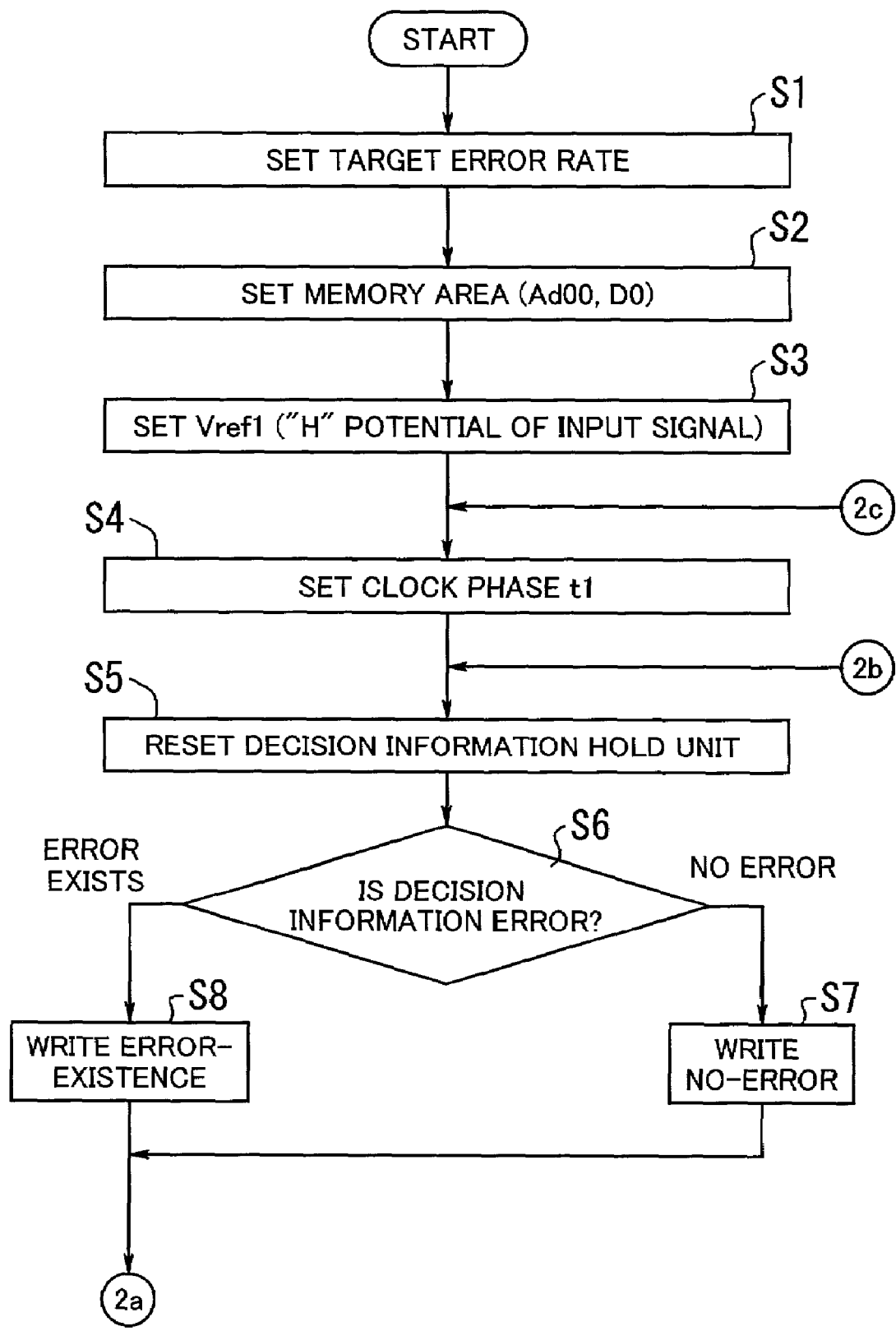
FIG. 22 is a flowchart of a part of an eye margin measurement.
Figure 23:
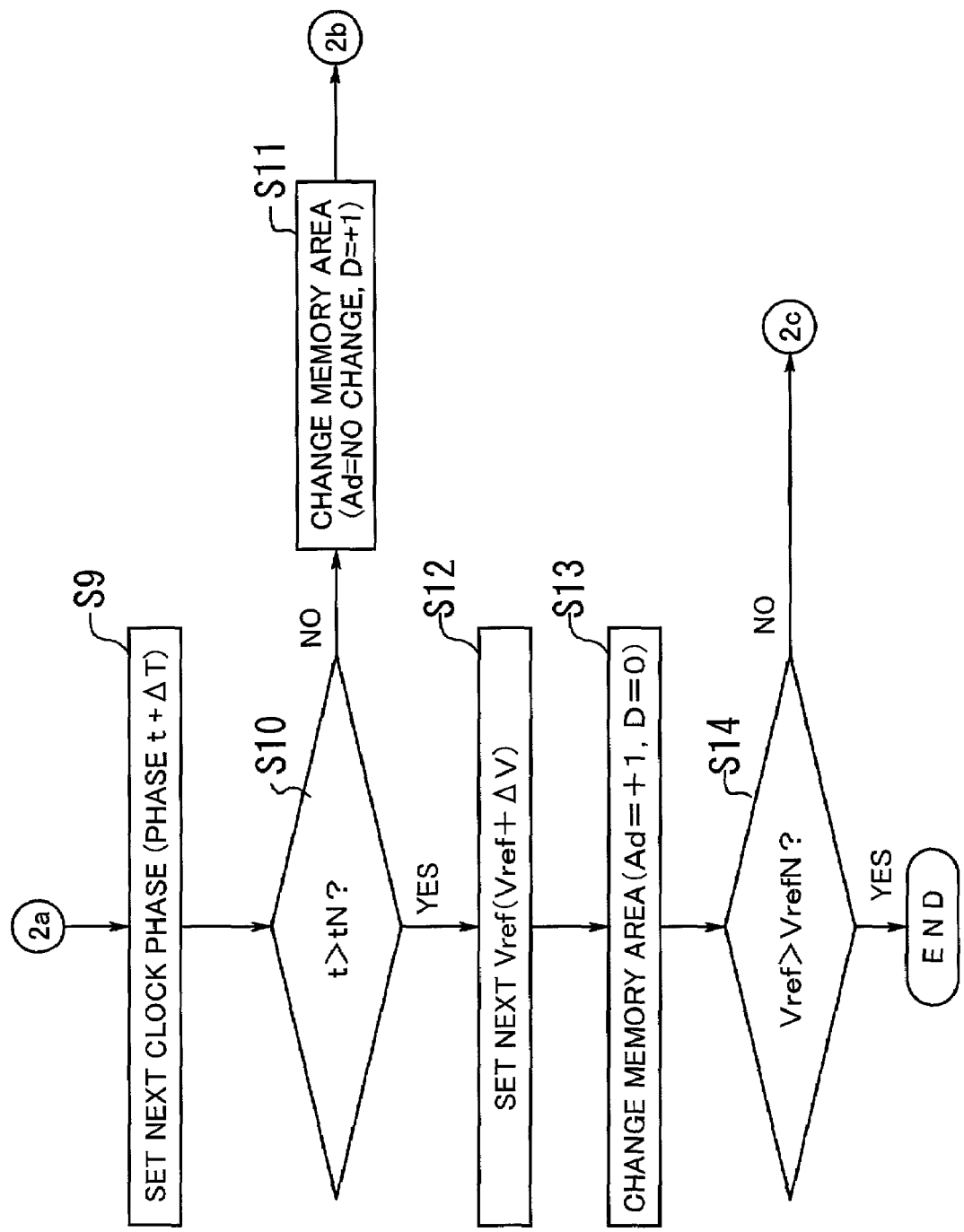
FIG. 23 is a flowchart of the remaining part of the eye margin measurement.

Next, a description will be given of the control sequence of the optimal point setting unit 25 as to the eye margin measurement with reference to flowcharts of FIGS. 22 and 23.

[S1] The target error rate is set (the reset timing cycle is set).
[S2] The memory area (Ad00, D0) is set.
[S3] Vref1 ("H" potential of the input signal) is set.
[S4] Clock phase t1 is set.
[S5] The decision information hold unit 24 is reset.
[S6] It is determined whether the decision information about the monitor point is error. If there is no error, the process proceeds to step S7. Otherwise, the process proceeds to step S8.
[S7] "No-error" is written into the memory, and the process proceeds to step S9.
[S8] "Error-existence" is written into the memory.
[S9] The step change to the next monitor point is performed. The clock phase for the next step is set (phase t+ΔT).
[S10] It is determined whether the phase t exceeds the upper limit phase tN. If the answer is YES, the process proceeds to step S12, and otherwise to step S11.
[S11] The memory area is changed (Ad is not changed, and D is incremented by +1). Then, the process returns to step S5.
[S12] Vref for the next step is set (Vref+ΔV).
[S13] The memory area is changed (Ad is incremented by +1 and D=0).
[S14] It is determined whether Vref exceeds the upper limit VrefN. If the answer is YES, the eye margin measurement for the monitor points amounting to the memory capacity is finished. Otherwise, the process returns to step S4.

Figure 24:
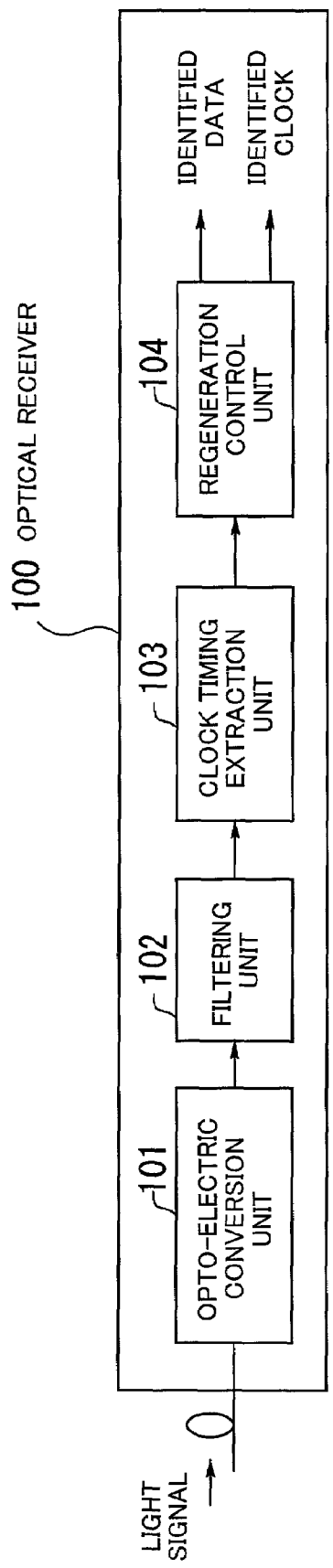
FIG. 24 is a block diagram of an optical receiver.

A description will now be given of an optical receiver to which the transmission device 1 according to one aspect of the present invention is applied. FIG. 24 is a block diagram of a structure of an optical receiver 100, which is made up of an opto-electric conversion unit 101, a filtering unit 102, a clock timing extraction unit 103 (which corresponds to the aforementioned clock timing extraction circuit 10), and a regeneration control unit 104 (which corresponds to the aforementioned regeneration control circuit 20).

The opto-electric conversion unit 101 converts the received light signal into an electric signal. The filtering unit 102 shapes the waveform of the input signal and limits the band of noise contained therein as a waveform equalizing control. The clock timing extraction unit 103 and the regeneration control unit 104 process the signal output from the filtering unit 102 as the input signal, so that 0/1 identified data and clock synchronized therewith are output.

An example of the optical receiver 100 is a transponder which receives light signals of different wavelengths (λ1-λn) sent by a TDM (Time Division Multiplexing) device and outputs each optical signal after converting them into a narrow-band light signal for WDM (Wavelength Division Multiplexing) transmission.

As described above, according to the present invention, the synchronizing clock is automatically extracted from the input signal on the basis of the transmission rate thereof, and the optimal point for identification (voltage, phase) for an arbitrary error rate is automatically set. Thus, there is no need to develop transmission devices each exclusively used for the respectively transmission rate and to manually perform cumbersome test and measurement. Thus, the transmission device has improved convenience, reliability and quality.

When the transmission device 1 of the present invention is applied to the optical receiver, the user can use it without consideration of the speed of optical transmission. Thus, it is easy to modify the specification of transmission speed and automatically optimize decision-making even when waveform dispersion occurs because of long-distance transmission using the optical fiber. Hence, high-performance signal receiving control is enabled. The transmission device 1 of the present invention is not limited to the optical receiver but other types of signal receiving devices.

As described hereinbefore, the transmission device according to the present invention performs the signal regeneration control so that the clock timing extraction circuit dynamically sets the frequency-dividing ratio to extract the clock timing based on the transmission rate of the input signal, and the regeneration control circuit sequentially sweeps the voltage threshold level and the extracted phase of clock with respect to the input signal to automatically measure the decision point within the valid zone of the eye pattern at which there is the least possibility that error occurs, the decision point thus identified being used as the optimal point. Thus, the clock can be extracted based on the transmission rate, so that the transmission device is very flexible and capable of automatically setting the optimal point with high accuracy. In addition, the highly reliable high-performance signal regeneration control is achieved.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A transmission device performing a signal regeneration control, comprising:
    a clock timing extraction circuit dynamically setting a frequency-dividing ratio based on a transmission rate of an input signal to perform a phase synchronization control so that the input signal and an oscillation output have a constant phase difference and extracting a clock timing based on the transmission rate; and
    a regeneration control circuit sequentially sweeping a voltage threshold level and a phase of an extracted clock with respect to the input signal to determine whether signal logic levels measured at adjacent monitor points match with each other and to automatically measure a decision point within a valid zone of an eye pattern at which there is the least possibility that error occurs and performing the regeneration control by using the decision point as an optimal point, wherein the regeneration control circuit performs said sweeping of the voltage threshold level and the phase of the extracted clock at intervals X in units of seconds determined from a relationship of $1/10^n=C/X$, where the target error rate is $10^{-n}$, and C is a cycle period of the input signal in units of seconds.

2. The transmission device as claimed in claim 1, wherein the clock timing extraction circuit comprises:
phase comparing means for comparing phases of the input signal and a frequency-divided clock to detect a phase difference therebetween;
averaging means for averaging the phase difference to generate a control voltage;
voltage-controlled oscillation means for oscillating a synchronizing clock based on the control voltage;
frequency-dividing means for dividing the frequency of the synchronizing clock to generate the frequency-divided clock; and
phase-locked loop control means for determining whether the control voltage falls within a set range to determine whether a phase-locked loop is in a locked state and dynamically setting the frequency-dividing ratio based on a result of determination.

3. The transmission device as claimed in claim 2, wherein the phase comparing means makes an exclusive-OR operation on a level of a rising edge of the frequency-divided clock and that of a falling edge thereof so that the phase difference is detected as a duty ratio.

4. The transmission device as claimed in claim 2, wherein the phase-locked loop control means sets a frequency-dividing ratio available before power off in the frequency-dividing means at the time of power off and sets a control voltage available before breaking of the input signal in the averaging means when the input signal breaks.

5. The transmission device as claimed in claim 1, wherein the regeneration control circuit comprises:
voltage threshold level setting means for making a decision on the input signal by using the voltage threshold level and generating measured data from the input signal;
clock phase setting means for setting a phase of the clock;
level decision control means for determining whether signal logic levels of the measured data at the adjacent monitor points match with each other, and providing the result of said determination as decision information;
decision information hold means for holding the decision information; and
optimal point setting means for identifying a decision point within the valid zone of the eye pattern at which there is the least possibility that error occurs from the decision information obtained by sequentially sweeping the voltage threshold level and the extracted phase of clock and performing the regeneration control in which the decision point thus identified is used as the optimal point.

6. The transmission device as claimed in claim 5, wherein the level decision control means pulls in phase a first output of the measured data triggered by a current clock and a second output of the measured data triggered by a delayed clock obtained by delaying the current clock by a fixed time, makes an exclusive-OR operation on the first and second outputs to make a level decision on the monitor point and generates the decision information.

7. The transmission device as claimed in claim 5, wherein the optimal point setting means applies an offset adjustment control to the clock timing extraction circuit when a maximum transmission rate of the input signal is equal to the rate of the synchronizing clock to thereby generate a through clock, the clock phase setting means selects the through clock to sweep the clock phase.

8. The transmission device as claimed in claim 5, wherein the optimal point setting means applies a count value control and a digital phase step control to the clock phase setting means when the transmission rate of the input signal is lower than that of the synchronizing clock to thereby generate a clock signal having a different frequency-dividing ratio, and applies an offset adjustment control to the clock timing extraction circuit to thereby generate a frequency-divided signal based on the clock signal, the clock phase setting means selects the frequency-divided clock to sweep the clock phase.

9. The transmission device as claimed in claim 5, wherein the optimal point setting means sets a reset cycle based on an error rate corresponding to the transmission rate of the input signal, and resets the decision information held in the decision information holding means on the basis of the reset cycle.

10. The transmission device as claimed in claim 9, wherein the optimal point setting means controls to shift a next monitor point without waiting for the reset cycle when recognizing that the decision information is indicative of error.

11. The transmission device as claimed in claim 5, wherein the optimal point setting means comprises a memory for memorizing the decision information about the monitor points, and determines, as the optimal point, a monitor point located in a memory area in which there is the least error with respect to the voltage threshold level and the clock phase.

12. The transmission device as claimed in claim 11, wherein the optimal point setting means memorizes the voltage threshold level and the clock phase at the monitor point determined as the optimal point, and performs the regeneration control using the memorized voltage threshold level and the clock phase at the time of restart.

13. A regeneration control circuit performing a regeneration control of an input signal, comprising:
voltage threshold level setting means for making a decision on the input signal by using a voltage threshold level and generating measured data from the input signal;
clock phase setting means for setting a phase of a clock for decision making;
level decision control means for determining whether signal logic levels of the measured data at adjacent monitor points match with each other, and providing the result of said determination as decision information;
decision information hold means for holding the decision information; and
optimal point setting means for identifying a decision point within a valid zone of an eye pattern at which there is the least possibility that error occurs from the decision information obtained by sequentially sweeping the voltage threshold level and the phase of the clock with respect to the input signal and performing the regeneration control in which the decision point thus identified is used as an optimal point,
wherein the voltage threshold level setting means changes the voltage threshold level or the clock phase setting means changes the phase of the clock at intervals X in units of seconds determined from a relationship of $1/10^n=C/X$, where the target error rate is $10^{-n}$, and C is a cycle period of the input signal in units of seconds.

14. An optical receiver receiving a light signal and performing a regeneration control, comprising:
an opto-electric conversion unit converting the light signal into an electric signal;

a filtering unit performing a waveform equalizing control of the electric signal;

a clock timing extraction unit dynamically setting a frequency-dividing ratio based on a transmission rate of the input signal to perform a phase synchronization control so that there is a fixed phase difference between the input signal and an oscillation output and extracting a clock timing based on the transmission rate; and a regeneration control unit sequentially sweeping a voltage threshold level and phase of the extracted clock with respect to the input signal to determine whether signal logic levels measured at adjacent monitor points match with each other and, based thereon, finding an optimal point within a valid zone of an eye pattern at which there is the least possibility that error occurs, wherein the regeneration control circuit performs said sweeping of the voltage threshold level and the phase of the extracted clock at intervals X in units of seconds determined from a relationship of $1/10^n = C/X$, where the target error rate is $10^{-n}$, and C is a cycle period of the input signal in units of seconds.

* * * * *